(12) United States Patent
Delfosse et al.

(10) Patent No.: US 12,068,759 B2
(45) Date of Patent: Aug. 20, 2024

(54) CONSTRUCTION OF LOOKUP DECODERS FOR STABILIZER CODES

(71) Applicant: Microsoft Technology Licensing, LLC, Redmond, WA (US)

(72) Inventors: Nicolas Guillaume Delfosse, Seattle, WA (US); Adam Edward Paetznick, Bellevue, WA (US); Alexander Vaschillo, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/820,687

(22) Filed: Aug. 18, 2022

(65) Prior Publication Data

US 2024/0056101 A1 Feb. 15, 2024

Related U.S. Application Data

(60) Provisional application No. 63/369,922, filed on Jul. 29, 2022.

(51) Int. Cl.
*H03M 13/00* (2006.01)
*H03M 13/01* (2006.01)
*H03M 13/11* (2006.01)
*H03M 13/15* (2006.01)

(52) U.S. Cl.
CPC ....... *H03M 13/1575* (2013.01); *H03M 13/01* (2013.01); *H03M 13/1128* (2013.01)

(58) Field of Classification Search
CPC ............. H03M 13/1575; H03M 13/01; H03M 13/1128; H03M 13/154; H03M 13/3746; H03M 13/47
See application file for complete search history.

(56) References Cited

U.S. PATENT DOCUMENTS

| | | | | |
|---|---|---|---|---|
| 9,748,976 | B2* | 8/2017 | Naaman | H03M 13/1525 |
| 9,762,262 | B2* | 9/2017 | Ashikhmin | H03M 13/1575 |
| 9,944,520 | B2* | 4/2018 | Ashikhmin | G06N 10/00 |

(Continued)

FOREIGN PATENT DOCUMENTS

WO 2021143265 A1 7/2021

OTHER PUBLICATIONS

Brown, et al., "Short Random Circuits Define Good Quantum Error Correcting Codes", In IEEE International Symposium on Information Theory, Jul. 7, 2013, pp. 346-350.

Chandra, et al., "Quantum Topological Error Correction Codes are Capable of Improving the Performance of Clifford Gates", In Journal of IEEE Access, vol. 7, Aug. 21, 2019, pp. 121501-121529.

Das, et al., "Lilliput: A Lightweight Low-latency Lookup-table based Decoder for Near-term Quantum Error Correction", In Repository of arXiv:2108.06569v1, Aug. 14, 2021, pp. 1-13.

(Continued)

*Primary Examiner* — Esaw T Abraham
(74) *Attorney, Agent, or Firm* — Alleman Hall & Tuttle LLP

(57) ABSTRACT

A method to build a lookup decoder for mapping error syndromes based on quantum-stabilizer code to corresponding error corrections comprises (A) enumerating a subset of error syndromes up to a maximum error weight based on the quantum-stabilizer code; (B) iterating through the subset of error syndromes to compute an error state of highest probability for each error syndrome of the subset, where the error state defines error in a qubit register of a quantum computer; and (C) for each error syndrome of the subset of error syndromes, storing in classical computer memory an error correction based on the error state of highest probability and mapped to that error syndrome.

20 Claims, 9 Drawing Sheets

(56) References Cited

U.S. PATENT DOCUMENTS

| | | | |
|---|---|---|---|
| 10,922,166 B2* | 2/2021 | Hogaboam | G06N 10/00 |
| 11,263,076 B2* | 3/2022 | Nickerson | G06F 11/10 |
| 11,288,121 B2* | 3/2022 | Katabarwa | G06N 10/00 |
| 11,321,627 B1 | 5/2022 | Arriola et al. | |
| 11,334,693 B1 | 5/2022 | Flammia | |
| 11,422,890 B2* | 8/2022 | Fowler | G06F 11/1076 |
| 11,444,636 B2* | 9/2022 | Lucarelli | H03M 13/2906 |
| 11,455,207 B2* | 9/2022 | Chamberland | G06F 11/1048 |
| 11,544,612 B2* | 1/2023 | Ashikhmin | G06N 10/00 |
| 2014/0118023 A1 | 5/2014 | Eastin | |
| 2016/0344414 A1 | 11/2016 | Naaman et al. | |
| 2019/0042972 A1 | 2/2019 | Zou et al. | |
| 2020/0401927 A1 | 12/2020 | Nickerson et al. | |
| 2021/0019223 A1 | 1/2021 | Chamberland et al. | |
| 2021/0042652 A1 | 2/2021 | Das et al. | |
| 2021/0374586 A1 | 12/2021 | Kliuchnikov et al. | |
| 2022/0215284 A1 | 7/2022 | Jamieson et al. | |
| 2023/0129732 A1 | 4/2023 | Schmitz et al. | |
| 2024/0062092 A1 | 2/2024 | Delfosse et al. | |

OTHER PUBLICATIONS

Klappenecker, et al., "Clifford Code Constructions of Operator Quantum Error-Correcting Codes", In Proceedings of IEEE Transactions on Information Theory, vol. 54, Issue 12, Dec. 2008, pp. 5760-5765.

"International Search Report and Written Opinion Issued in PCT Application No. PCT/US2023/025121", Mailed Date: Oct. 5, 2023, 13 Pages.

"Office Action Issued in U.S. Appl. No. 17/820,701", Mailed Date: Sep. 26, 2023.

International Search Report and Written Opinion received for PCT Application No. PCT/US2023/025114, Jan. 31, 2024, 14 pages.

Notice of Allowance mailed on Feb. 7, 2024, in U.S. Appl. No. 17/820,701 8 pages.

Sergey, Bravyi et al., "Improved Classical Simulation of Quantum Circuits Dominated by Clifford Gates", Arxiv.org, Cornell University Library, 201 Olin Library Cornell University Ithaca, NY 14853, Jan. 28, 2016, 20 pages.

* cited by examiner

Algorithm 1: Lookup decoder LUD[$\mathcal{S}, \mathcal{E}, M$] for Stabilizer codes.

input : A set of stabilizer generators $\mathcal{S} = \{S_1, \ldots, S_r\}$ of a stabilizer code with length $n$. A maximum error weight $M$. A subset of Pauli errors $\mathcal{E} \subseteq \overline{\mathcal{P}}_n$.

output: A lookup decoder $D$ for the set of errors in $\mathcal{E}$ with weight $\leq M$.

40  Initialize $D(\sigma) = I$ for all syndromes $\sigma$.
41  for *all* $w = 1, 2, \ldots, M$ do
42      for *all errors* $E \in \mathcal{E}$ *with weight* $w$ do
43          Compute $\sigma = \sigma(E)$.
44          If $D(\sigma) = I$, set $D(\sigma) = E$.
45  return $D$.

*FIG. 4*

Algorithm 2: Lookup decoder constructed using Pauli information sets.

input  : A set of stabilizer generators $\mathcal{S} = \{S_1, \ldots, S_r\}$ of a stabilizer code with length $n$. A maximum error weight $M$. A subgroup of Pauli errors $\mathcal{E} \subseteq \overline{\mathcal{P}}_n$.

output: A lookup decoder $D$ for the set of errors in $\mathcal{E}$ with weight $\leq M$.

62 Initialize $D(\sigma) = I$ for all syndromes $\sigma$.
63 Compute a generating matrix $\mathbf{G}'$ in standard form for the group of errors in $\mathcal{E}$ with syndrome 0.
64 for *all syndromes* $\sigma \in \mathbb{Z}_2^s$ do
65     if $\mathcal{E}$ *contains an error $h$ with syndrome* $\sigma$ then
66         Set $D(\sigma) = h$.
67         Construct $\mathbf{G}$ by adding a row to $\mathbf{G}'$ corresponding to $h$.
68         Put $\mathbf{G}$ in standard form by Gaussian elimination (operating only on the added row).
69         Let $G_1, \ldots, G_r$ be the generators associated with the rows of $\mathbf{G}$.
70         Let $\hat{G}_1, \ldots, \hat{G}_r$ be the pivot operators associated with the rows of $\mathbf{G}$.
71         for *all* $w = 1, 2, \ldots, M$ do
72             if $|D(\sigma)| = w$ then
73                 Break.
74             for *all products* $\hat{g} = \hat{G}_1^{\alpha_1} \ldots \hat{G}_{r-1}^{\alpha_{r-1}} \hat{G}_r$ *with weight $w$ where* $\alpha_i \in \mathbb{Z}_2$ do
75                 Compute $g = G_1^{\alpha_1} \ldots G_{r-1}^{\alpha_{r-1}} G_r$.
76                 if $|D(\sigma)| > |g|$ then
77                     set $D(\sigma) = g$.
78     if $|D(\sigma)| > M$ then
79         $D(\sigma) = I$.

80 return $D$.

*FIG. 7*

Algorithm 3: Construction of a Pauli error with given syndrome.

input : A Pauli matrix $\mathbf{S}$ in standard form with $n$ columns and $r$ rows. A vector $\sigma \in \mathbb{Z}_2^r$.

output: A Pauli error $h \in \overline{\mathcal{P}}_n$ such that $h\mathbf{S}_j = (-1)^{\sigma_j}\mathbf{S}_j h$ for all $j = 1,\ldots,r$.

82  Set $h = I$.
83  for $j = 1,\ldots,r$ do
84   if $\sigma_j = 1$ then
85    Let $i$ be the column of the leading coefficient of row $j$ of $\mathbf{S}$.
86    if $\mathbf{S}_{j,i} = X$ or $Y$ then
87     Multiply $h_i$ by $Z$.
88    if $\mathbf{S}_{j,i} = Z$ then
89     Multiply $h_i$ by $X$.

90  return $h$.

*FIG. 8*

Algorithm 4: Frame of a rotated CSS code.

input : A rotated CSS code $C(S)$ with length $n$ with minimum distance $d > 1$.

output: A product of single-qubit Clifford operations that maps $C(S)$ onto a CSS code.

92   Construct the intersection graph $G_\cap(S)$.

93   Find a 2-coloration of the vertices of $G_\cap(S)$.

94   for *each color* $c = 0, 1$ do

95      Construct the set $V^{(c)}$ of vertices with color $c$ for $c = 0$.

96      Construct the set $S^{(c)} = \{S_i \in S | i \in V^{(c)}\}$.

97      for *each qubit* $q = 1, 2, \ldots, n$ do

98          Let $A_q^{(c)} \in \{X, Y, Z\}$ be the only non-trivial Pauli matrix in the restriction of $S^{(c)}$ to qubit $q$.

99   for *each qubit* $q = 1, 2, \ldots, n$ do

100      Find a single-qubit Clifford gate $g_q$ such that $g_q A_q^{(0)} g_q^{-1} = X$ and $g_q A_q^{(1)} g_q^{-1} = Z$.

101   return $g = \otimes_{q=1}^n g_q$.

*FIG. 10*

CONSTRUCTION OF LOOKUP DECODERS FOR STABILIZER CODES

CROSS REFERENCE TO RELATED APPLICATIONS

This application claims priority to U.S. Provisional Patent Application Ser. No. 63/369,922, filed Jul. 29, 2022, the entirety of which is hereby incorporated herein by reference for all purposes.

BACKGROUND

A quantum computer is a physical machine configured to execute logical operations based on or influenced by quantum-mechanical phenomena. Such logical operations may include, for example, mathematical computation. Current interest in quantum-computer technology is motivated by analysis suggesting that the computational efficiency of an appropriately configured quantum computer may surpass that of any practicable non-quantum computer when applied to certain types of problems. Such problems include computer modeling of natural and synthetic quantum systems, integer factorization, data searching, and function optimization as applied to systems of linear equations and ma-chine learning.

SUMMARY

One aspect of this disclosure relates to a method to build a lookup decoder for mapping error syndromes based on quantum-stabilizer code to corresponding error corrections. The method comprises (A) enumerating a subset of error syndromes up to a maximum error weight based on the quantum-stabilizer code; (B) iterating through the subset of error syndromes to compute an error state of highest probability for each error syndrome of the subset, where the error state defines error in a qubit register of a quantum computer; and (C) for each error syndrome of the subset of error syndromes, storing in classical computer memory an error correction based on the error state of highest probability and mapped to that error syndrome.

Another aspect of this disclosure relates to a computer system coupled operatively to a quantum computer. The computer system comprises a processor and, operatively coupled to the processor, computer memory holding instructions that cause the processor to build a lookup decoder for mapping error syndromes based on quantum-stabilizer code to corresponding error corrections. The instructions comprise: instructions (A) for enumerating a subset of error syndromes up to a maximum weight based on the quantum-stabilizer code; instructions (B) for iterating through the subset of error syndromes to compute an error state of highest probability for each error syndrome of the subset, where the error state defines error in a qubit register of a quantum computer; and instructions (C) for storing in the computer memory, for each error syndrome of the subset of error syndromes, an error correction based on the error state of highest probability and mapped to that error syndrome, wherein the error correction mapped to a given error syndrome reverses the error state of highest probability computed for that error syndrome.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

BRIEF DESCRIPTION OF THE DRAWINGS

FIG. 4 shows aspects of a comparative example algorithm for building a lookup decoder for quantum-stabilizer code.

FIG. 7 shows aspects of an example algorithm for building a lookup decoder using Pauli information sets.

FIG. 8 shows aspects of an example algorithm for construction of a Pauli error with a given error syndrome.

FIG. 10 shows aspects of an example algorithm for finding the frame of a rotated Calderbank-Shor-Steane (CSS)code.

DETAILED DESCRIPTION

1. Overview of Quantum Error Correction

This disclosure relates to error correction in quantum computing. In any quantum computer the quantum state held in a qubit register may be to some degree corrupted. Potential sources of corruption include measurement error, quantum-gate implementation error, and decoherence of the quantum state over time. The term 'error' refers herein to corruption from any of these sources. Quantum error correction seeks to limit the error so that the quantum state retains its computational value. Typically the high-level strategy of quantum error correction borrows somewhat from error correction in classical information theory—viz., the data to be protected from error is made redundant to a certain degree via an 'encoding' process. Then, subsequent to processing, transmission, or prolonged storage, a 'decoding' process is used to recover the uncorrupted data. In the present context, 'stabilizer code' is program code that appends redundant data, in the form of ancillary qubits, to a register state to enable quantum error correction. A 'decoder' is program code that processes the appended and possibly corrupted register state after a quantum operation, or after prolonged storage, to recover the uncorrupted register state. More specifically, a 'lookup decoder' is map stored in classical computer memory, which pairs an error syndrome to the appropriate correction.

2. Quantum-Computer Architecture

Figure 1:
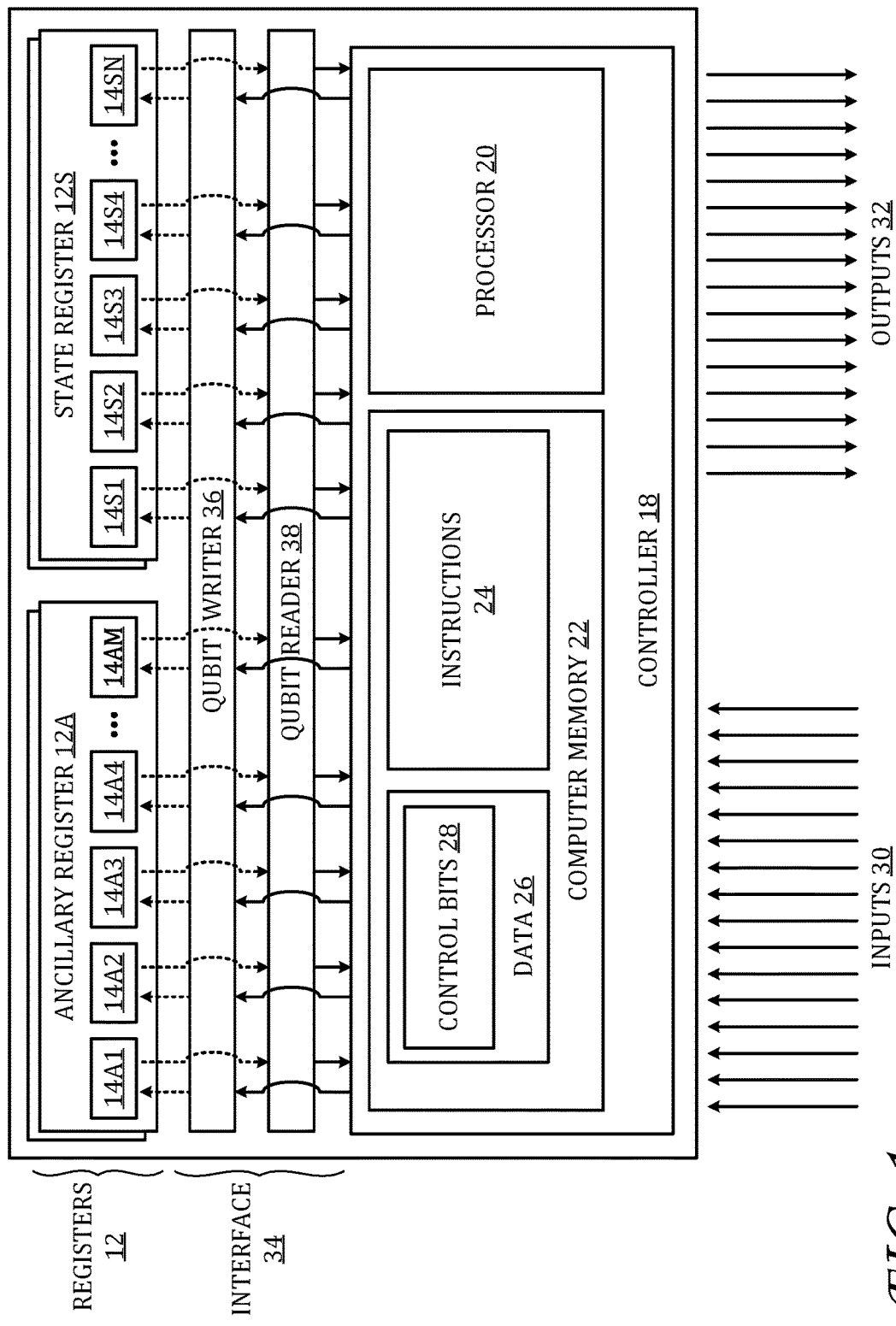
FIG. 1 shows aspects of an example quantum computer.

In order to provide a context for quantum-error correction, some aspects of an example quantum-computer architecture will first be described. Turning now to the drawings, FIG. 1 shows aspects of an example quantum computer 10 configured to execute quantum-logic operations (vide infra). Whereas conventional computer memory holds digital data in an array of bits and enacts bit-wise logic operations, a quantum computer holds data in an array of qubits and operates quantum-mechanically on the qubits in order to implement the desired logic. Accordingly, quantum computer 10 of FIG. 1 includes a set of qubit registers 12—e.g., state register 12S and ancillary register 12A. Each qubit register includes a series of qubits 14. The number of qubits in a qubit register is not particularly limited but may be determined based on the complexity of the quantum logic to be enacted by the quantum computer.

Qubits 14 of qubit register 12 may take various forms, depending on the desired architecture of quantum computer 10. Each qubit may comprise: a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial- or spin-electronic states, electron holes in semiconductor junctions entrained via an electrostatic trap, a coupled quantum-wire pair, an atomic nucleus addressable by magnetic resonance, a free electron in helium, a molecular magnet, or a metal-like carbon nanosphere, as non-limiting examples. A qubit may be implemented in the plural processing states corresponding to different modes of light propagation through linear optical elements (e.g., mirrors, beam splitters and phase shifters), as well as in states accumulated within a Bose-Einstein condensate. More generally, each qubit 14 may comprise any particle or system of particles that can exist in two or more discrete quantum states that can be measured and manipulated experimentally.

Figure 2:
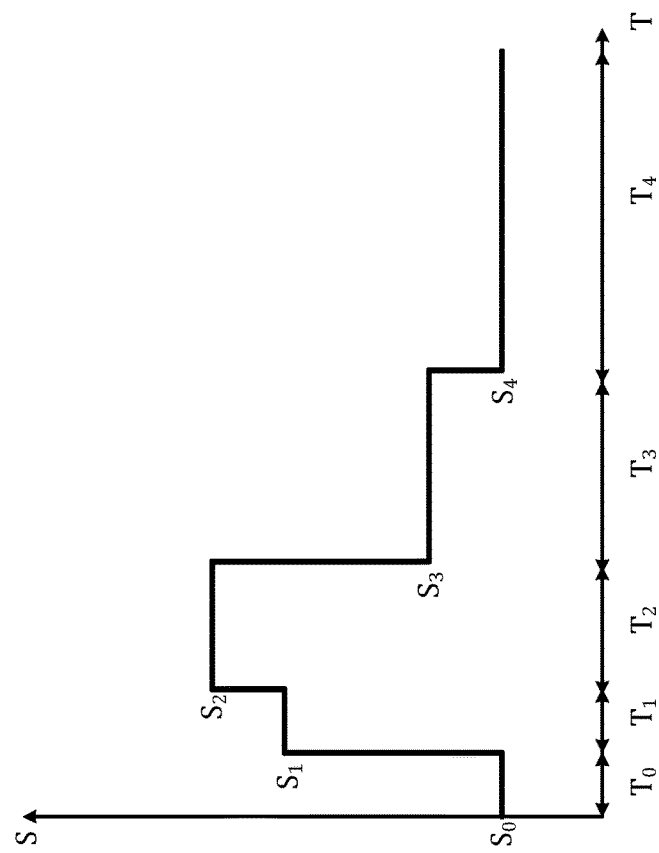
FIG. 2 illustrates a Bloch sphere, which graphically represents the quantum state of one qubit of a quantum computer.

FIG. 2 is an illustration of a Bloch sphere 16, which provides a graphical description of some quantum mechanical aspects of an individual qubit 14. In this description, the north and south poles of the Bloch sphere correspond to the standard basis vectors $|0\rangle$ and $|1\rangle$, respectively—up and down spin states, for example, of an electron or other fermion. The set of points on the surface of the Bloch sphere comprise all possible pure states $|\Psi\rangle$ of the qubit, while the interior points correspond to all possible mixed states. A mixed state of a given qubit may result from decoherence, which may occur because of undesirable coupling to external degrees of freedom.

Returning now to FIG. 1, quantum computer 10 includes a controller 18. The controller may include at least one processor 20 and associated computer memory 22. Processor 20 may be coupled operatively to peripheral componentry, such as network componentry, to enable the quantum computer to be operated remotely. Processor 20 may take the form of a central processing unit (CPU), a graphics processing unit (GPU), or the like. As such, controller 18 may comprise classical electronic componentry. The terms 'classical' and 'non-quantum' are applied herein to any component that can be modeled accurately without considering the quantum state of any individual particle therein. Classical electronic components include integrated, microlithographed transistors, resistors, and capacitors, for example. Computer memory 22 may be configured to hold program instructions 24 that cause processor 20 to execute any function or process of controller 18. The computer memory may also be configured to hold additional data 26. In some examples, data 26 may include a register of classical control bits 28 that influence the operation of the quantum computer during run time—e.g., to provide classical control input to one or more quantum-gate operations. In examples in which qubit register 12 is a low-temperature or cryogenic device, controller 18 may include control componentry operable at low or cryogenic temperatures—e.g., a field-programmable gate array (FPGA) operated at 77K. In such examples, the low-temperature control componentry may be coupled operatively to interface componentry operable at normal temperatures.

Controller 18 of quantum computer 10 is configured to receive a plurality of inputs 30 and to provide a plurality of outputs 32. The inputs and outputs may each comprise digital and/or analog lines. At least some of the inputs and outputs may be data lines through which data is provided to and/or extracted from the quantum computer. Other inputs may comprise control lines via which the operation of the quantum computer may be adjusted or otherwise controlled.

Controller 18 is operatively coupled to qubit registers 12 via quantum interface 34. The quantum interface is configured to exchange data (solid lines) bidirectionally with the controller. The quantum interface is further configured to exchange signal associated with the data (dashed lines) bidirectionally with the qubit registers. Depending on the physical implementation of qubits 14, such signal may include electrical, magnetic, and/or optical signal. Via signal conveyed through the quantum interface, the controller may interrogate and otherwise influence the quantum state held in any, some, or all of the qubit registers, as defined by the collective quantum state of the qubits therein. To that end, the quantum interface includes qubit writer 36 and qubit reader 38. The qubit writer is configured to output a signal to one or more qubits of a qubit register based on write-data received from the controller. The qubit reader is configured to sense a signal from one or more qubits of a qubit register and to output read-data to the controller based on the signal. The read-data received from the qubit reader may, in some examples, be an estimate of an observable to the measurement of the quantum state held in a qubit register. Taken together, controller 18 and interface 34 may be referred to as a 'controller system'.

In some examples, suitably configured signal from qubit writer 36 may interact physically with one or more qubits 14 of a qubit register 12, to trigger measurement of the quantum state held in the one or more qubits. qubit reader 38 may then sense a resulting signal released by the one or more qubits pursuant to the measurement, and may furnish read-data corresponding to the resulting signal to controller 18. Stated another way, the qubit reader may be configured to output, based on the signal received, an estimate of one or more observables reflecting the quantum state of one or more qubits of a qubit register, and to furnish the estimate to controller 18. In one non-limiting example, the qubit writer may provide, based on data from the controller, an appropriate voltage pulse or pulse train to an electrode of one or more qubits, to initiate a measurement. In short order, the qubit reader may sense photon emission from the one or more qubits and may assert a corresponding digital voltage level on a quantum-interface line into the controller. Generally speaking, any measurement of a quantum-mechanical state is defined by the operator O corresponding to the observable to be measured; the result R of the measurement is guaranteed to be one of the allowed eigenvalues of O. In quantum computer 10, R is statistically related to the qubit-register state prior to the measurement, but is not uniquely determined by the qubit-register state.

Pursuant to appropriate input from controller 18, quantum interface 34 may be configured to implement one or more quantum-logic gates to operate on the quantum state held in a qubit register 12. The term 'state vector' refers herein to the quantum state held in the series of qubits 14S of state register 12S of quantum computer 10. The state vector is a convenient representation that may be used to interpret measurement outcomes. Whereas the function of each type of logic gate of a classical computer system is described according to a corresponding truth table, the function of each type of quantum gate is described by a corresponding operator matrix. The operator matrix operates on (i.e., multiplies) the complex vector representing a qubit register state and effects a specified rotation of that vector in Hilbert space.

For example, the Hadamard gate H is defined by $$H = \frac{1}{\sqrt{2}} \begin{bmatrix} 1 & 1 \\ 1 & -1 \end{bmatrix}. \tag{1}$$

The H gate acts on a single qubit; it maps the basis state |0⟩ to (|0⟩+|1⟩)/√2, and maps |1⟩ to (|0⟩−|1⟩)/√2. Accordingly, the H gate creates a superposition of states that, when measured, have equal probability of revealing |0⟩ or |1⟩.

The phase gate S is defined by $$S = \begin{bmatrix} 1 & 0 \\ 0 & e^{i\pi/2} \end{bmatrix}. \tag{2}$$

The S gate leaves the basis state |0⟩ unchanged but maps |1⟩ to $e^{i\pi/2}$|1⟩. Accordingly, the probability of measuring either |0⟩ or |1⟩ is unchanged by this gate, but the phase of the quantum state of the qubit is shifted. This is equivalent to rotating Ψ by 90 degrees along a circle of latitude on the Bloch sphere of FIG. 2.

Some quantum gates operate on two or more qubits. The SWAP gate, for example, acts on two distinct qubits and swaps their values. This gate is defined by $$\text{SWAP} = \begin{bmatrix} 1 & 0 & 0 & 0 \\ 0 & 0 & 1 & 0 \\ 0 & 1 & 0 & 0 \\ 0 & 0 & 0 & 1 \end{bmatrix}. \tag{3}$$

A 'Clifford gate' is a quantum gate that belongs to the Clifford group—viz., a set of quantum gates that effect permutations of the Pauli operators. For the n-qubit case the Pauli operators form a group $$P_n = \{e^{i\theta\pi/2}\sigma_{j_1} \otimes \ldots \otimes |\theta=0,1,2,3, j_k=0,1,2,3\}, \tag{4}$$

where $\sigma_0, \ldots \sigma_3$ are the single-qubit Pauli matrices. The Clifford group is then defined as the group of unitaries that normalize the Pauli group, $$C_n = \{V \in U_{2^n} | V P_n V^\dagger = P_n\}. \tag{5}$$

The foregoing list of quantum gates and associated operator matrices is non-exhaustive, but is provided for ease of illustration. Other quantum gates include Pauli −X, −Y, and −Z gates, the √NOT gate, additional phase-shift gates, the √SWAP gate, controlled cX, cY, and cZ gates, and the Toffoli, Fredkin, Ising, and Deutsch gates, as non-limiting examples.

Figure 3:
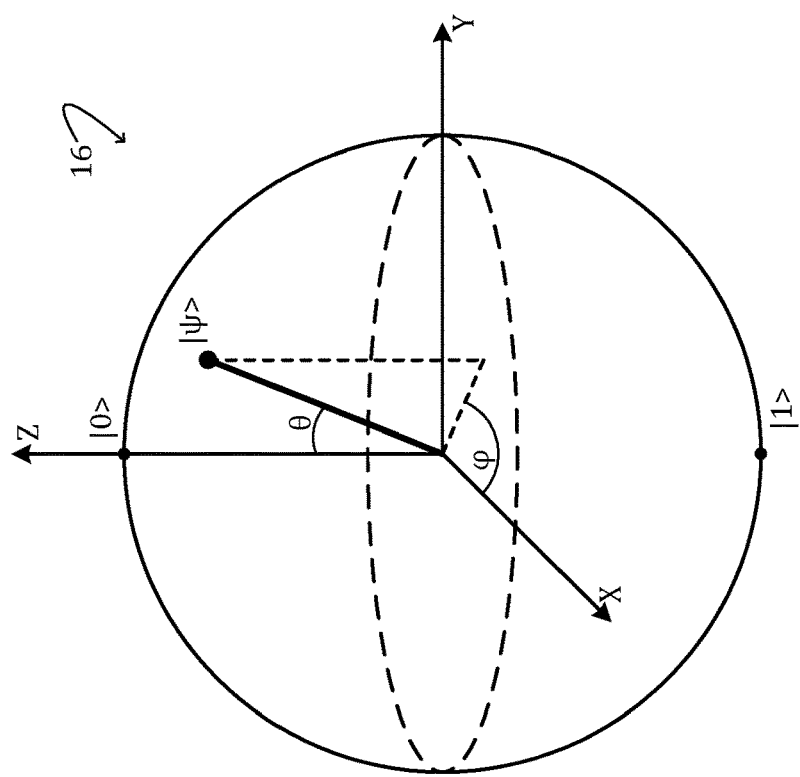
FIG. 3 shows aspects of an example signal waveform for effecting a quantum-gate operation in a quantum computer.

Continuing in FIG. 1, suitably configured signal from qubit writer 36 of quantum interface 34 may interact physically with one or more qubits 14 of a qubit register 12 so as to assert any desired quantum-gate operation. As noted above, the desired quantum-gate operations include specifically defined rotations of a complex vector representing a qubit register state. In some examples, in order to effect a desired rotation O, the qubit writer may apply a predetermined signal level $S_i$ for a predetermined duration T. In some examples, plural signal levels may be applied for plural sequenced or otherwise associated durations, as shown in FIG. 3, to assert a quantum-gate operation on one or more qubits of a qubit register. In general, each signal level S and each duration $T_i$ is a control parameter adjustable by appropriate programming of controller 18.

The terms 'oracle' and 'quantum algorithm' are used herein to describe a predetermined sequence of elementary quantum-gate and/or measurement operations executable by quantum computer 10. An oracle may be used to transform the quantum state of a qubit register 12 to effect a classical or non-elementary quantum-gate operation or to apply a density operator, for example. In some examples, an oracle may be used to enact a predefined 'black-box' operation f(⊗), which may be incorporated into a complex sequence of operations. To ensure adjoint operation, an oracle mapping n input qubits |⊗) to m output or ancilla qubits |y =f(⊗)⟩ may be defined as a quantum gate O(|⊗) ⊕ |y⟩) operating on the (n+m) qubits. In this case, O may be configured to pass the n input qubits unchanged but combine the result of the operation f(⊗) with the ancillary qubits via an XOR operation, such that O(|⊗) ⊕ |y⟩)=|⊗) ⊕ |y ⊕f(⊗)⟩.

Implicit in the description herein is that each qubit 14 of any qubit register 12 may be interrogated via quantum interface 34 so as to reveal with confidence the standard basis vector |0⟩ or |1⟩ that characterizes the quantum state of that qubit. In some implementations, however, measurement of the quantum state of a physical qubit may be subject to error. Accordingly, any qubit 14 may be implemented as a logical qubit, which includes a grouping of physical qubits measured according to an error-correcting oracle that reveals the quantum state of the logical qubit with above-threshold confidence.

3. Lookup Decoder Introduction

A decoder is an important feature of any quantum error correction scheme. It is a classical subroutine whose goal is to identify the error which occurs in a quantum system based on the outcome of the syndrome extraction circuit i.e., the 'syndrome'. Discussed herein are different strategies to build decoders for small stabilizer codes based on lookup tables or hash maps. More specifically, a correction corresponding to each syndrome is pre-computed and stored in memory. Given a syndrome, the decoding comprises returning the stored correction. The term 'lookup decoder' is applied herein to any such decoder.

Lookup decoders, which return a pre-computed correction for each syndrome, are not efficient because the pre-computation time grows exponentially with the code length. They are useful for small codes, however, because they can be executed with low latency. A lookup decoder can also be used as a pre-decoder which corrects only the most common error patterns to reduce the resource requirements of a more sophisticated decoder. In order to extend the practical range of lookup decoders, classical information set decoding techniques are applied herein to the case of stabilizer codes, resulting in a faster construction for lookup decoders. This disclosure also addresses the decoding of Calderbank-Shor-Steane (CSS) codes and rotated CSS codes, which are obtained by applying single-qubit Clifford gates to CSS codes. The CSS decoder is extended to rotated CSS codes by exploiting a graphical characterization of rotated CSS codes. Finally, construction of lookup decoders for stabilizer codes is discussed—codes whose stabilizer group contains a large rotated CSS subgroup. This disclosure proves that the problem of computing a maximal rotated CSS subgroup of a stabilizer group is nondeterministic polynomial-time (NP) complete.

Efficient decoding of a general stabilizer code may not be possible using this approach because the memory cost of storing all the corrections is exponential in the code length, and because the construction of the decoder runs in exponential time. However, once built, a lookup decoder can be executed extremely fast because it only requires memory reads. lookup decoders are well suited to providing fast decoding for quantum error correction with small codes [Ref. 1]. A field-programmable gate array (FPGA) implementation of a lookup table decoder for small surface codes was proposed in [Ref. 2]. A lookup decoder may also be used as a pre-decoder to speed-up another decoder or to reduce the resources consumed by a more sophisticated decoder [Ref. 3].

One of the objectives herein is to design a lookup decoder that can be used to correct errors with an arbitrary small stabilizer code. Naively, one can build a lookup decoder for a stabilizer code by computing the syndromes of all Pauli errors with weight up to M and storing a minimum weight error for each syndrome. This requires enumerating over all Pauli errors with weight up to M. Proposed herein is a construction that produces the same decoder using fewer syndrome computations for many codes. This construction is obtained by applying information set decoding [Ref. 4]. Information set decoding is a standard tool in code-based cryptography [Ref. 5], [Ref. 6] and is also used to compute the minimum distance of classical linear codes [Ref. 7].

The problem of designing quantum algorithms for information set decoding was considered previously in the literature [Ref. 8] to design quantum attacks on code-based cryptosystems. The present work is not related to this question and is based on different techniques. The objective here is to construct a decoder for quantum stabilizer codes using a classical computer.

To apply information set decoding to the setting of stabilizer codes, a notion of information set for subgroups of the Pauli group is introduced. As in the classical case, an information set for a Pauli group can be computed by Gaussian elimination. The main difference in the case of linear codes is that a single column in a Pauli matrix can have rank two. This disclosure shows that information sets containing a minimum number of rank-two columns are advantageous to minimize the cost of the construction of the lookup decoder for stabilizer code.

A subclass of stabilizer codes called CSS codes [Ref. 9], [Ref. 10] which are defined by stabilizer generators in $\{I, X\}^n$ or $\{I, Z\}^n$ is also addressed. As a result, one can build a lookup decoder for X and Z errors independently which leads to a faster decoder construction than for general stabilizer codes. CSS codes behave like classical codes, and one can immediately port the classical information decoders from linear codes to CSS codes.

Discussed also are rotated CSS codes—i.e., CSS codes whose stabilizer generators have been conjugated by a product of single-qubit Clifford operations. A graphical characterization of rotated CSS codes is provided, as well as an algorithm that computes the rotation that maps them back to a CSS code. These codes have the same advantage of CSS codes in terms of decoding. Namely, one can split Pauli errors on each qubit into two types of error that can be corrected independently.

The structure of CSS codes and rotated CSS codes is exploited to reduce the cost of constructing a lookup decoder for these codes. More generally, it is natural to expect that a more efficient decoder construction can be designed for a stabilizer code that contains large rotated CSS subgroup. Such a construction is proposed for stabilizer codes that contain only a small number of non-CSS generators (or non-rotated-CSS generators). Given a stabilizer code, a maximum rotated CSS subgroup of the stabilizer group can be determined and exploited in order to speed-up the lookup decoder construction. It is shown, however, that the problem of finding a maximum rotated subgroup of a stabilizer group is NP-complete.

In the remainder of this disclosure, the formalism of stabilizer codes is reviewed, in Section 4. Then, in Section 5, information sets for Pauli groups is introduced and applied to the decoding of stabilizer codes. CSS codes and rotated CSS codes are studied in Section 6.

4. Technical Context

Reviewed first is the formalism of stabilizer codes and the decoding problem for these codes [Ref. 11].

4.1. Pauli Operators

Throughout this disclosure, the notation $P_n$ is used for the group of n-qubit Pauli operators $\alpha P_1 \otimes \ldots P_n$ with $\alpha \in \{\pm 1, \pm i\}$ and $P_i \in \{I, X, Y, Z\}$. The quotient of the Pauli group by the subgroup of phase operators $\{\pm I, \pm iI\}$ is denoted $\overline{P}_n$. $\overline{P}_{X_n} = \{I, X\}^{\otimes n}$ denotes the set of X operators of $\overline{P}_n$, and $\overline{P}_{Z_n} = \{I, Z\}^{\otimes n}$ is the set of Z operators of $\overline{P}_n$.

4.2. Stabilizer Codes

A stabilizer code with length n is defined by a set of n-qubit commuting Pauli operators $S_1, \ldots, S_r \in P_n$ such that the group generated by the $S_i$ does not contain $-I$. The operators $S_i$ are called the stabilizer generators and the group they generate is the stabilizer group. Pauli errors are considered to be operators of the phase-free Pauli group $\overline{P}_n$ because phase errors have no effect on quantum states. Operators of the stabilizer group up to a phase $\pm 1$ are referred to as the stabilizers. In what follows, S denotes the set $\{S_1, \ldots, S_r\}$ of stabilizer generators and <S> is the stabilizer group. The syndrome of a Pauli error $E \in \overline{P}_n$ for the stabilizer code C(S) is defined to be the vector $\sigma = \sigma(E) \in \mathbb{Z}_2^r$ such that $\sigma_i = 1$ if E anti-commute with $S_i$. The minimum distance of a stabilizer code is the minimum weight of a Pauli error with trivial syndrome which is not a stabilizer. A Pauli error that has trivial syndrome is referred to as a logical operator of the code. It is a non-trivial logical operator if it is a logical operator which is not a stabilizer. The minimum distance of a stabilizer code is the minimum weight of a non-trivial logical operator of the code.

4.3. Lookup Decoder

A decoder for a stabilizer code with length n and with r stabilizer generators is a map $D: \mathbb{Z}_2^r \to \overline{P}_n$ that sends a syndrome onto a correction. A decoder corrects an error E if $ED(\sigma(E))$ is a stabilizer. Otherwise, the correction fails. Lookup decoder refers to a pre-computed decoder D. This map can be stored in memory as a lookup table or as a hash map. A hash map may be preferable in term of space cost when $D(\sigma)$ is constant over large subsets of syndromes. Because it is pre-computed and stored in memory the decoder returns a correction is constant time. However, it generally occupies a large amount of memory and the pre-computing time is significant. This is not a scalable solution but can be useful to explore the performance of small codes or as a partial decoder or a pre-decoder.

4.4. Pauli Matrix and Gaussian Elimination

A r×n Pauli matrix is defined to be a matrix with r rows and n columns with coefficients in {I, X, Y, Z}. Bold-face letters M, G, H, ... denote Pauli matrices. For i=1, ..., r, the i-th row of a Pauli matrix M is a n-qubit Pauli operator denoted $M_i \in \overline{P}_n$.

In what follows, a Pauli matrix is used to represent a subgroup of the Pauli group. A generator matrix for a subgroup $\mathcal{G}$ of $\overline{P}_n$ is a Pauli matrix G with n columns whose rows $G_1, \ldots, G_r$ form a set of generators of the group $\mathbb{Z}$. Recall that Pauli operators herein are defined up to a phase. As a result, a generator matrix is a complete description of a subgroup of $\overline{P}_n$.

The rank of a subgroup $\mathbb{Z}$ of $\overline{P}_n$ is defined to be the minimum number of generators of $\mathbb{Z}$ and the rank of a Pauli matrix is the rank of the subgroup generated by its rows.

One can compute the rank of a Pauli matrix using Gaussian elimination—i.e., by a sequence of $O(r^2)$ row operations. For a Pauli matrix, a row operation is either swapping two rows or multiplying a row by another row. These operations preserve the group generated by the rows of the matrix.

A standard form convenient for the purpose of this disclosure is now introduced. A Pauli matrix G is said to be in standard form if it satisfies the following: (a) the matrix is in row echelon form; (b) each row is non-trivial; (c) the leading entry of each row is either X, Y or Z; and (d) each column containing a leading entry contains either only one non-trivial coefficient X, Y or Z or it contains two non-trivial coefficients X and Z.

For example, the following matrix is in standard form $$\begin{pmatrix} X & Z & I & Y & X & I & I \\ I & I & X & Z & Z & I & I \\ I & I & Z & Y & X & I & I \\ I & I & I & I & I & Y & I \\ I & I & I & I & I & I & Z \end{pmatrix} \quad (6)$$

The leading entries of the rows of this matrix are included in column 1,3,6 and 7. As re-quested in the definition of the standard form, the four columns 1,3,6 and 7 contain either a single non-trivial Pauli matrix or they contain a X and Z. The following Proposition is a straightforward application of Gaussian elimination.

Proposition 1. Let $\mathcal{G}$ be a subgroup of $\overline{P}_n$ with r generators. Using Gaussian elimination, one can produce a generator matrix for $\mathcal{G}$ in standard form by applying a sequence of $O(rn)$ row operations to the matrix G.

The cost of producing a generator matrix in standard form is $O(rn^2)$ bit operations. One can read some properties of a Pauli matrix in its standard form.

Lemma 1. The rank of a Pauli matrix is given by the number of rows of its standard form.

Proof. The number of rows is clearly an upper bound on the rank. Moreover, inspecting the leading terms of non-trivial rows, it can be seen that no non-trivial relation can exist between these rows.

5. Information Set Decoders for Stabilizer Codes

Reviewed in this section is the basic strategy to build lookup decoders for stabilizer codes. A more economical way to build these decoders is described here, which can be seen as a generalization of classical information set decoders [Ref. 4]. The key ingredient is a notion of information set for subgroups of the Pauli group introduced in this section.

5.1. Stabilizer Codes

FIG. 4 shows aspects of a comparative example algorithm for building a lookup de-coder LUD[S, E, M] for quantum-stabilize code. More specifically, Algorithm 1 describes a naive construction of a lookup decoder for stabilizer codes. The algorithm loops over all errors with weight up to M, from lower weight to higher weight errors and stores a minimum weight correction for each syndrome observed. In the remainder of this disclosure, LUD[S, E, M] denotes the lookup decoder returned by Algorithm 1.

Proposition 2v. Let C(S) be a stabilizer code with minimum distance d. Let D =LUD[S, $\overline{P}_n$, M] be the lookup decoder returned by Algorithm 1. If M >(d — 1)/2 then the decoder D corrects all Pauli errors with weight up to (d−1)/2. Moreover, the construction of D requires $$\sum_{w=1}^{M} \binom{n}{w} 3^w \quad (7)$$

syndrome computations.

Proof. The objective here is to prove that D corrects any Pauli error E with weight $\leq$(d−1)/2. By construction of the lookup decoder, for all errors E with weight up to M, $|D(\sigma(E))| \leq |E|$. As a result, the residual error after correction satisfies $$|ED(\sigma(E))| \leq |E| + |D(\sigma(E))| \leq 2|E| \leq (d-1). \quad (8)$$

Moreover, the syndrome of $D(\sigma(E))$ is $\sigma(E)$ which implies that the residual error $ED(\sigma(E))$ has trivial syndrome. Therefore, by definition of the minimum distance, the residual error must be a stabilizer, proving that the decoder achieves the code distance. The number of syndrome computation corresponds to the number of non-trivial Pauli errors with weight up to M.

The number of syndrome computations can be used as a proxy to the complexity of the construction of a lookup decoder. It is also an upper bound on the number of pairs (syndrome, correction) stored in memory by the lookup decoder. Proposed in the rest of this section is a different strategy to construct LUD[S, $\overline{P}_n$, M], which, in many cases, allows the same lookup table to be constructed using significantly fewer syndrome computations.

5.2. Information Set for Pauli Groups

Information sets of classical codes are used in attacks on code-based cryptography [Ref. 4] or in algorithms to compute the minimum distance of classical codes [Ref. 7]. An information set for a r×n Pauli matrix G is defined herein as a minimal subset $I \subset \{1, \ldots, n\}$ such that the sub-matrix $G_{|I}$ of G induced by the columns indexed by I satisfies rank $G_{|I}$=rank G. This definition is an immediate generalization of the classical notion of information sets. By definition, if I is an information set, any Pauli operator of the group generated by the rows of G is fully determined by its restriction to the qubits of I.

One could use the isomorphism between $\overline{P}_n$ and $\mathbb{Z}_2^{2n}$ to import the classical notion of information set to this setting. However, the notion of weight of Pauli operators does not match with the binary weight in $\mathbb{Z}_2^{2n}$. To avoid to adjust the notion of weight, the notion of information set, as introduced above, is preferred.

Proposition 3. Let $\mathcal{G}$ be a subgroup of $\overline{P}_n$. If G is a generator matrix for $\mathcal{G}$ in standard form, then the set of columns supporting the leading entries of the non-trivial rows of G is an information set for G.

Proof. The submatrix $G_{|I}$ of G is in standard form. Based on Lemma 1 this shows that rank G=rank $G_{|I}$.

A classical information set for a linear code is defined similarly. It is a minimal subset I of columns of a generator matrix with maximum rank. However, the structure of the Pauli group leads to some technical differences between these two cases. For instance, the size of a classical information set is always equal to the dimension of the classical code. For Pauli groups, a single column of G may have rank two and therefore the size of an information set can be any integer between $\lceil \text{rank } G/2 \rceil$ and rank G.

5.3. Weight-Increasing Encoding for a Pauli Group

Proposed here is a representation of the operators of a group $\mathcal{G}$ as the image of Pauli operators acting on an information set of $\mathcal{G}$. In the subsequent sections, this map is used for a rapid enumeration of all Pauli operators of $\mathcal{G}$ with weight up to w.

Let $\mathcal{G}$ be a subgroup of $\overline{P}_n$ with a generator matrix G in standard form and let I be its information set. With each row with index i=1,2, . . . of the Pauli matrix G, two operators, $G_i \in \overline{P}_n$ and $\hat{G}_i$ of $\overline{P}_I$, are associated. Here $\overline{P}_I$ denotes the set of phase-less Pauli operators acting on qubits indexed by the elements of I. The generator $G_i$ is the Pauli operator corresponding to row i of G. The pivot operator $\hat{G}_i$ is the weight-one Pauli operator defined by the leading entry of row i of G. The operators $G_1, \ldots, G_s$ form a generating set of the group $\mathcal{G}$ and the pivot operators form a generating set for the restriction $\mathcal{G}_{|I}$ of $\mathcal{G}$ to I.

For example, the generators and the pivot operators associated with the matrix given in Eq. (6) are $G_2=X_3Z_4Z_5$ and $\hat{G}_2=X_3$. The encoding map associated with the matrix G in standard form is defined as $$\varphi G: \mathcal{G}_{|I} \to \mathcal{G}$$

$$\prod_{i=1}^{\text{rank } G} \hat{G}_i^{\alpha_i} \mapsto \prod_{i=1}^{\text{rank } G} G_i^{\alpha_i} \quad (10)$$

where $\alpha_i \in \mathbb{Z}_2$. It encodes an operator of the restricted group $\mathcal{G}_{|I}$ into a element of $\mathcal{G}$.

Proposition 4. [weight-increasing encoding] The encoding map $\varphi G$ associated with a Pauli matrix in standard form is a group isomorphism. Moreover, for any Pauli operator P $\in \mathcal{G}_{|I}$, $|\varphi G(P)| \geq |P|$.

Proof. This is clearly a group morphism. By definition of the standard form, it is easy to check that its kernel is trivial which proves the injectivity. Moreover, by definition of information sets, the two groups $\mathcal{G}$ and $\mathcal{G}_{|I}$ have the same cardinality. Therefore this is an isomorphism. Its inverse is the restriction to the qubits of I, which implies that $\varphi G$ is weight-increasing.

5.4. Construction of Lookup Decoder Based on Information Sets

Figure 5:
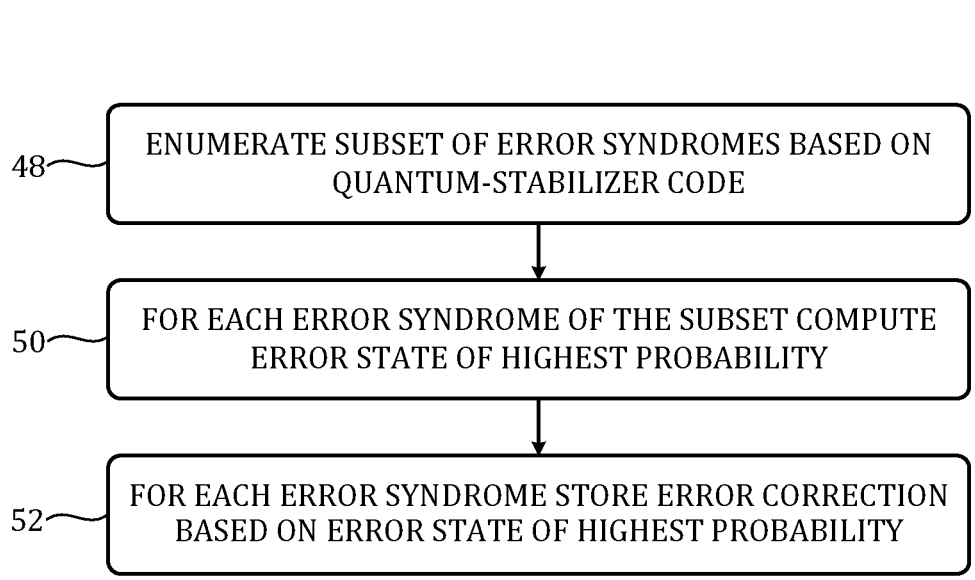
FIG. 5 shows aspects of an example method to build a lookup decoder for quantum-stabilizer code.

This section revisits the construction of the lookup decoder. FIG. 5 shows aspects of an example method 46 to build a lookup decoder for quantum-stabilizer code that executes on a quantum computer. The resulting lookup decoder is configured to map error syndromes based on quantum-stabilizer code to corresponding error corrections. The detailed nature of the quantum-stabilizer code is not particularly limited in method 46. In some examples the quantum-stabilizer code may be a CSS code. In some examples the quantum-stabilizer code may be a rotated CSS code. Various ranges of density or sparsity of the lookup decoder are envisaged; in some examples the lookup decoder may comprise a hash map.

At 48 of method 46, a subset of error syndromes based on the quantum-stabilizer code is enumerated. The enumerated subset of error syndromes extends to a maximum error weight M. Typically, when the subset of error syndromes is enumerated, another subset within the parent set of error syndromes for the quantum-stabilizer code is omitted.

At 50 the method iterates through the subset of error syndromes to compute an error state of highest probability for each error syndrome of the subset. Here and elsewhere, the error state defines error in a qubit register of the quantum computer. In some examples the error state includes at least one classical bit string with each bit corresponding to a different qubit of the qubit register. More particularly, the at least one classical bit string may include a classical bit string of X-type quantum errors and a classical bit string of Z-type quantum errors.

In some examples, iterating through the subset of error syndromes comprises step-ping through a weight-increasing encoding map and generating a complete set of Pauli errors up to a predetermined weight for each error syndrome. In some examples, iterating through the subset of error syndromes comprises iterating through a set of products of pivot operators $\hat{g}=\hat{G}_1^{\oplus_1} \ldots \hat{G}_r^{\alpha_r}$ with weight w. More particularly, the pivot operators may be selected based on an information set with a minimum number of rank-one elements. In some examples, iterating through the subset of error syndromes comprises, when the maximum weight M is small relative to code length n, iterating in order of increasing weight of the error states of each syndrome.

At 52, for each error syndrome of the subset of error syndromes, an error correction based on the error state of highest probability is stored in a classical computer and mapped to that error syndrome. Typically the error correction mapped to a given error syndrome reverses the error state of highest probability computed for that error syndrome.

Operationally, method 46 may be enacted on a classical computer system coupled operatively to a quantum computer. As described hereinafter, the classical computer system comprises one or more processors and, operatively coupled to the one or more processors, computer memory holding instructions corresponding to method 46. Such instructions may include instructions (A) corresponding to step 48, instructions (B) corresponding to step 50, etc. In examples in which the classical computer memory is coupled to plural processing cores, iteration at 50 and storage at 52, as applied to different error syndromes, may be enacted in parallel via the plural processing cores.

The manner of utilizing a lookup table built according to method 46 is not particularly limited. In some examples, a classical computer system coupled operatively to a quantum computer may hold, in computer memory, instructions (D) to recognize a runtime error syndrome generated via operation of the quantum computer. It may hold instructions (E) to retrieve the error correction stored for the runtime error syndrome, and optional instructions (F) to adjust operation of the quantum computer based on the error correction retrieved. Thus, in some examples error correction may be applied to an intermediate stage of quantum computation, and the corrected intermediate may be fed back to the quantum computer for a subsequent stage of quantum computation. In other examples, the error correction may be used to dynamically tune one or more operating parameters of the quantum computer for improved (less error-prone) operation. In still other examples, the error correction may be applied to the final stage of the quantum computation, such that no feedback is required.

Figure 6:
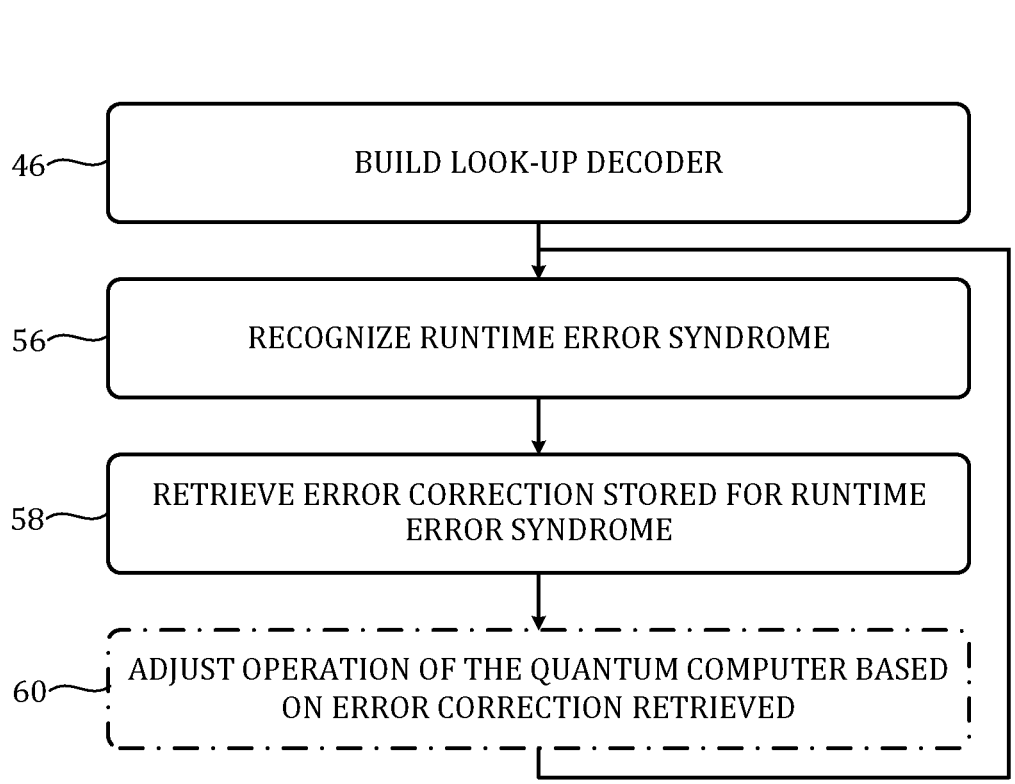
FIG. 6 shows aspects of an example run-time method for using a lookup decoder for quantum error correction.

In view of the foregoing description, FIG. 6 shows aspects of an example run-time method 54 for using a lookup decoder for quantum error correction. The illustrated run-time method includes steps 56 through 60, corresponding to instructions D through F hereinabove.

By generalizing information set decoders, a construction of the same lookup decoder as in Algorithm 1 is obtained, but the construction here uses fewer syndrome computations. A significant ingredient is the weight increasing encoding map, introduced in Section 5.3, and the following coset enumeration lemma which facilitates the generation of all Pauli errors with a given syndrome with weight up to w.

For any subset A of $\bar{P}_n$, denote by A[w] the set of operators of A with weight$\leq$w. The following result is an immediate application of Proposition 4.

Lemma 2. Coset enumeration lemma Let r>0. Let G be a Pauli matrix in standard form with r rows and let $\mathcal{G}'=(G_1, \ldots, G_{r-1})$. If I is the information set associated with G, then for all w=0, 1, . . . , $$A[w] \subseteq \varphi G(\hat{A}[w])$$

where $A = G_r \mathcal{G}'$ and $\hat{A} = \hat{G}_r \mathcal{G}'_{|I}$

This lemma is used in Algorithm 2. To produce all the errors with syndrome a and weight up to w, Lemma 2 is applied, where $\mathcal{G}'$ is the group of errors with trivial syndrome and Gr is an arbitrary error with syndrome $\sigma$.

FIG. 7 shows aspects of an example Algorithm 2 for building a lookup decoder using Pauli information sets. To obtain an arbitrary error with a given syndrome, a set of Pauli operators $E_1, \ldots E_r$ is precomputed, such that $E_i$ commute with all the stabilizer generators $S_j$ except $S_i$. The syndrome of Et is the i th vector of the standard basis of $\mathbb{Z}_2^n$. It is possible, then to build an error E with syndrome $\sigma=(\sigma_1, \ldots, \sigma_r)$ as $E=\Pi_{i=1}^r E_i^{\sigma_i}$. For simplicity, this step is omitted in the description of Algorithm 2.

The core subroutine of Algorithm 2 is a loop over the set of products of pivot operators of the form $g=\hat{G}_1^{\alpha_1} \ldots \hat{G}_r^{\alpha_r}$ with weight w. It is easy to generate all these products with a given weight because each pivot operator $\hat{G}_i$ has weight one.

The cost of Algorithm 2 depends on the structure of the pivot group of the matrix G. The signature of a Pauli matrix G in standard form is defined to be the pair $(s_1, S_2)$ where $s_j$ is the number of columns c $\in$ I such that rank $G_{|c}=j$. By definition, the signature of a Pauli matrix H satisfies $s_1+s_2=|I|$ and $s_1+2s_2=$rank G.

Proposition 5. Let C(S) be a stabilizer code with minimum distance d and with r stabilizer generators. Let D=LUD[S, $\bar{P}_n$, M] be the lookup decoder returned by Algorithm 2. If M$\geq$(d−1)/2 then the decoder D corrects all Pauli errors with weight up to (d−1)/2. Moreover, if the matrix G' in Algorithm 2 has signature $(s_1, s_2)$, the construction of D requires at most $$2^r \sum_{w_1=0}^{min(M,s_1+1)} \sum_{w_2=0}^{min(M-w_1,s_2+1)} \binom{s_1+1}{w_1}\binom{s_2+1}{w_2} 3^{w_2} \quad (11)$$

syndrome computations.

Proof. The decoder D returns a minimum weight error E with syndrome a for all syndrome a which is reached by an error with weight <M. Therefore, by the same argument as in the proof of Proposition 2, the decoder D corrects all Pauli errors with weight up to (d−1)/2 if M>(d−1)/2.

Let $(s_1(\sigma), s_2(\sigma))$ be the signature of the extended matrix G corresponding to the syndrome $\sigma$. The number of syndrome computation is upper bounded by $$\sum_{\sigma \in \mathbb{Z}_2^r} \sum_{w_1=0}^{min(M,s_1(\sigma))} \sum_{w_2=0}^{min(M-w_1,s_2(\sigma))} \binom{s_1(\sigma)}{w_1}\binom{s_2(\sigma)}{w_2} 3^{w_2} \quad (12)$$

Moreover, $(s_1(\sigma), s_2(\sigma))=(s_1+1, s_2)$ or $(s_1-1, s_2+1)$ which means that for all $\sigma$, $s_1(\sigma) \leq s_1+1$ and $s_2(\sigma) \leq S_2+1$. Plugging in the bounds on $s_1(\sigma)$ and $s_2(\sigma)$ in Eq. 12, the expected bound is obtained.

5.5. Information Sets Minimizing the Number of Syndrome Computations

Constructed in this section are information sets that minimize the upper bound on the number of syndrome computation in Algorithm 2. The following lemma demonstrates that in order to minimize Eq 11, information sets containing a minimum number of rank-two elements should be used. The notation $$c(a, b) = \sum_{w_1=0}^{min(M,a)} \sum_{w_2=0}^{min(M-w_1,b)} \binom{a}{w_1}\binom{b}{w_2} 3^{w_2} \quad (13)$$

may be used so that the upper bound on the number of syndrome computations in Proposition 5 is given by $2^r c(s_1+1, s_2+1)$.

Lemma 3. Let I and I' be two information sets for the same group with respective signatures $(s_1, s_2)$ and $(s_1', s_2')$. If $s_1$ then $c(s_1, s_2) \leq c(s_1, s_2)$.

Proof. Let $P(a, b)=\bar{P}_{X,a} \times \bar{P}_b$ and let P(a, b) [w] be the set of Pauli operators of P(a, b) with weight w=0,1, . . . , a+b. The cardinality of this set is $$c(a,b)=|P(a,b)[w]| \quad (14)$$

The objective here is to prove that $|P(S_1', s_2')[w]| \leq |P(s_1, s_2)[w]|$. Because they correspond to the same group, the two signatures $(s_1, s_2)$ and $(s_1', s_2')$ satisfy $s_1+2s_2=s_1'+2s_2'$ which is the rank of the group. Let $m=s_2-s_2'$. Then, $s_1'+=2(s_2-S_2)=2m >0$.

Define the group morphism $f:P(s_1', s_2') \to P(s_1, s_2)$ by if $1 \leq i \leq S_1$, $f(X_i)=X_i$, (15)

if $1 \leq j \leq m$, $f(X_{s_1+2j})=X_{s_1+j}$ and $f(X_{s_1+2j+1})=Z_{s_1+j}$, (16)

if $1 \leq i \leq S_2'-S_1'$, $f(X_{s_1'+i})=X_{s_1+m+i}$ and $f(Z_{s_1'+i})=Z_{s_1+m+i}$. (17)

The map f is a bijection that replaces 2 m copies of $\{I, X\}$ in $P(s_1', s_2')$ by m, copies of $\{I, X, Y, Z\}$. Because this transformation can only decrease the weight of Pauli operators, it induces an injective map $P(S_1', s_2')[w] \to P(S_1, s_2)[w]$ for all w. This map is not surjective when m>0, that is when $s_1'>s_1$. This yields $|P(S_1', s_2')[w]|<|P(S_1, s_2)[w]|$ which, together with Eq. (14), concludes the proof of the lemma.

Proposed now is a construction of an information set maximizing $s_1$. Based on the previous lemma, this results in minimizing the bound of Eq. (11). The basic idea is to permute the columns of the generator matrix to put the rank-one columns first. The permuted matrix is then put in standard form. Given a permutation $\pi$ of the qubit set $\{1, \ldots, n\}$ and a Pauli matrix G, $\pi(G)$ denotes the matrix obtained by applying the permutation to the columns of G.

Proposition 6. Let $\mathcal{G}$ be a subgroup of $\overline{P}_n$ with generator matrix G and let $\pi$ be a permutation of $\{1, \ldots, n\}$. Let G' be the matrix obtained by putting $\pi(G)$ in standard form. If I is the information associated with G', then $\pi^{-1}(I)$ is an information set for $\mathcal{G}$. Moreover, if $\pi$ is such that all the rank-one columns of $\pi(G)$ are placed before the rank-two columns of $\pi(G)$, then $\pi^{-1}(I)$ has signature $(s_1, s_2)$ with maximum $s_1$.

Proof. If I is the information associated with G', then $\pi^{-1}(I)$ is an information set for $\mathcal{G}$ because a permutation of the column does not affect the rank.

Denote by $\pi(G)=[G_1, G_2]$ the two blocks of the matrix $\pi(G)$ where $G_1$ contains the columns of G with rank $\leq 1$ and $G_2$ contains the rank-two columns. The maximum value of $s_1$ is upper bounded by the rank of the submatrix of G containing the rank-one columns, that is $s_1 \leq $ rank $G_1$.

Assertion. After putting $\pi(G)$ in standard form, one obtains a matrix $G'=[G_1', G_2']$. The matrix $G_1'$ coincides with the matrix obtained by putting $G_1$ in standard form, up to additional trivial rows.

Based on the assertion, rank $G_1'$=rank $G_1$, which is the maximum value of $s_1$. It remains to be shown that the information set I contains rank $G_1'$ columns of G with rank one.

Using the assertion again and Proposition 3, it can be seen that the intersection of I with the columns of $G_1'$ is an information set for $G_1'$. Moreover, its signature is of the form $(s_1, 0)$ for some $s_1$. Because for all information sets $s_1+2s_2$ is equal to the rank of the matrix, $s_1=$rank $G_1'$ which is the maximum possible value for $s_1$.

5.6. Computation of an Error with a Given Syndrome

FIG. 8 shows aspects of an example Algorithm 3 for construction of a Pauli error with a given error syndrome. The construction is useful in connection to Algorithm 2 above, which makes use of error h with syndrome $\sigma$.

Proposition 7. Given a generator matrix S in standard form for a stabilizer group, Algorithm 3 returns an error h with syndrome $\sigma$. Moreover, h satisfies lilt $|h| \leq \min(|\sigma|, |I|)$ where I is the information set corresponding to S.

Proof. By construction, the error h is constructed in such a way that it anti-commutes with row $S_j$ of S if $\sigma_j=1$. This proves that the syndrome of h is $\sigma$. Moreover, $|h| \leq |\sigma|$ a because the error h constructed in the Algorithm is a product a $|\sigma|$ weight-one operators. Also, $|h| \leq |I|$ because the support of h is included in I.

Assume that an error h with syndrome $\sigma$ and with weight $w_h$ is used in Algorithm 2. Then, the loop over all weight $w=1, \ldots, M$ terminates in the worst case once it reaches $w=w_h$, because the breaking condition is triggered. Therefore, this loop requires at most $\Sigma_{w=1}^{w_h-1} \binom{n}{w}$ syndrome computations.

To minimize the bound on the weight of h and the number of syndrome computations in Algorithm 2, it is possible to use a permutation of the columns like in Section 5.5. However, instead of generating an information set containing a maximum of rank-one columns, it is desirable to produce a minimum size information set. This is equivalent to maximizing the number of rank-two columns in the information set and this can be achieved by permuting the columns of S to place the rank-two columns before the rank-one columns.

5.7. Other Possible Improvements

Several improvements of Algorithm 2 are possible. First, when M is small compared to the code length n, many syndromes are not reached by errors with weight $\leq M$. In this case, instead of running over all possible syndromes, one loop over all syndromes of errors with weight w for $w=1, 2, \ldots, M$. Second, naively, generating a product of w generators G, costs $w-1$ multiplications of Pauli operators. This number can be reduced to a single multiplication of Pauli operators per iteration using a monotone Gray code [Ref. 12], [Ref. 13]. Third, to further reduce the number of syndrome computations used to build a lookup decoder, it is possible to leverage other ideas developed in the context of classical information set decoding such as the use of multiple information sets [Ref. 7] or the use of incomplete information sets [Ref. 14]. Fourth, one can use the code symmetry. This is especially useful in the case of cyclic codes [Ref. 4] or BCH codes [Ref. 15]. More generally, one could exploit the automorphism group of the stabilizer code to cut down the construction cost and the memory requirements. Fifth, the construction of the lookup decoder proposed in Algorithm 2 may be parallelized by splitting the work corresponding to different syndromes.

6. CSS Codes and Rotated CSS Codes Decoders

The CSS construction [Ref. 9], [Ref. 10] is one of the most popular constructions of quantum codes. A CSS code is a stabilizer code defined by stabilizer generators which are either X Pauli operators or Z Pauli operators. As a result the decoding problem can be decomposed into two independent problems: correction of X errors using the syndrome of Z stabilizer generators and correction of Z errors using the syndrome of X stabilizer generators.

In this section, CSS codes are reviewed. Introduced then is the class of rotated CSS codes which are CSS codes rotated by a product of local Clifford operations. Proposed next is a graphical characterization of rotated CSS codes; their decoding problem is then discussed. Finally, a way to reduce the cost of the construction of a decoder is explained for a stabilizer code containing a large rotated CSS subcode. It is shown, however, that finding a maximum rotated CSS subcode of a stabilizer code is NP-complete.

6.1. CSS Decoder

In what follows, the subscript X is used to denote the objects associated with the X stabilizer generators. The set of X stabilizer generators is denoted $S_X$, the number of X stabilizer generators is denoted $r_X$, the syndrome of an error relative to the X stabilizer generators is a vector of $\mathbb{Z}_2^{r_X}$ denoted $\sigma_X$. Similarly, the notation $S_Z$ is used for the set of Z stabilizer generators, $r_x$ for the number of Z stabilizer generators and $\sigma_Z$ for the corresponding syndrome. The whole stabilizer group of the CSS code is $S=S_X \cup S_Z$, and the full syndrome is $\sigma=(\sigma_X, \sigma_Z)$.

A standard strategy to correct Pauli errors with a CSS code is to correct separately its X part and its Z part. This leads to the following standard result.

Proposition 8. Let C(S) be a CSS code with minimum distance d. Let $D_X$=LUD[$S_X$, $\overline{P}_{Z,n}$, M] and $D_Z$=LUD[$S_Z$, $\overline{P}_{X,n}$, M] computed with Algorithm 1 and let $D(\sigma)=D_X(\sigma_X) D_Z(\sigma_Z)$ If M≥(d−1)/2 then the decoder D corrects all Pauli errors with weight up to (d−1)/2. Moreover, the construction of D requires $$2\sum_{w=1}^{M} \binom{n}{w} \quad (18)$$

syndrome computations.

Proof. Let E be a Pauli error with weight |E|<(d−1)/2. $E=E_X E_Z$ where $E_X$ is a X error and $E_Z$ is a Z error and each of the components has weight at most |E|. The syndrome $\sigma_X(E)$ depends only on the component $E_Z$ of E and $D_X(\sigma_X(E))=D_X(\sigma_X(E_Z))$ is a Z error with syndrome $\sigma_X(E)=\sigma_X(E_Z)$ such that $|D_X(\sigma_X(E_Z))| \leq |E_Z|$. Therefore, the residual Z error has trivial syndrome and it has weight at most $$|E_Z D_X(\sigma_X(E))| \leq 2|E_Z| \leq (d-1) \quad (19)$$

which proves that it is a stabilizer. By swapping the role of X and Z, one can show with the same argument that the X residual error after correction $E_X D_Z(\sigma_Z(E))$ is a stabilizer. This proves that the combined decoder D corrects E.

Like in the case of stabilizer codes, it is possible to speed-up the construction of the decoder using information sets. Using Algorithm 2, it is possible to build this decoder using at most $$2^{r_Z}\sum_{w=0}^{min(M,n-r_Z)} \binom{n-r_Z}{w} + 2^{r_X}\sum_{w=0}^{min(M,n-r_X)} \binom{n-r_X}{w} \quad (20)$$

syndrome computations. This is because the signature of a subgroup of $\overline{P}_{X_n}$ or $\overline{P}_{Z_n}$ is of the form $(s_1, 0)$. In the case of CSS codes, all the techniques developed for classical information set decoding [Ref. 4], [Ref. 15], [Ref. 7] can directly be imported to build the decoders $D_X$ and $D_Z$.

The decoder obtained does not return a minimum weight correction. Instead, it minimizes the weight of the X component and the weight of the Z component of the correction. However, it still achieves the code distance, i.e., it corrects all errors with weight up to (d−1)/2. The main advantage of building a decoder by correcting separately X error and Z errors is that it reduces the complexity of the construction of the decoder.

6.2. Rotated CSS codes

A rotated CSS code is defined to be the image of a CSS code under a product of single-qubit Clifford operations. Equivalently, it is a stabilizer code with stabilizer generators $gS_i g^\dagger$ for i=1, ..., r where the $S_i$ are the stabilizer generators of a CSS code and g is a product of single-qubit Clifford operations. g refers to the frame of the rotated CSS code.

The motivation to introduce rotated CSS codes is that one can build a satisfying lookup decoder for these codes with fewer syndrome computations than for general stabilizer codes like in the case of CSS codes. The first difficulty is to identify a rotated CSS code. Proposed herein is a graphical characterization of rotated CSS codes.

Two Pauli operators are said to be parallel if they coincide on the intersection of their support. Otherwise, it is said that these operators intersect. For example, (IXXI) and (XXIZ) are parallel whereas (YYXI) and (XXIZ) intersect. The intersection graph of a set S={$S_1$, ..., $S_r$} of Pauli operators, denoted G∩(S), is defined to be the graph with vertex set V={1, 2, ..., r} such that i and j are connected by an edge iff $S_i$ and $S_j$ intersect.

Figure 9A:
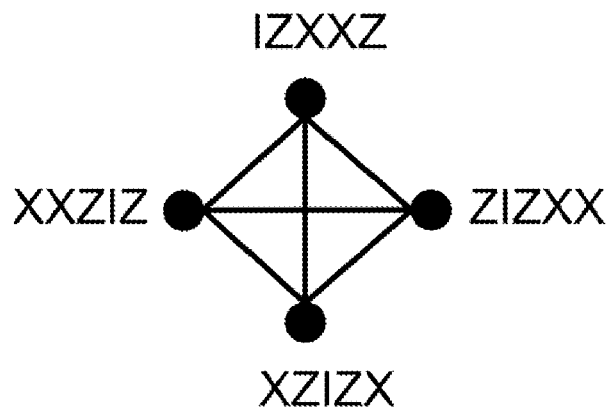
FIG. 9A shows an intersection graph of the generators of a five-qubit code.
Figure 9B:
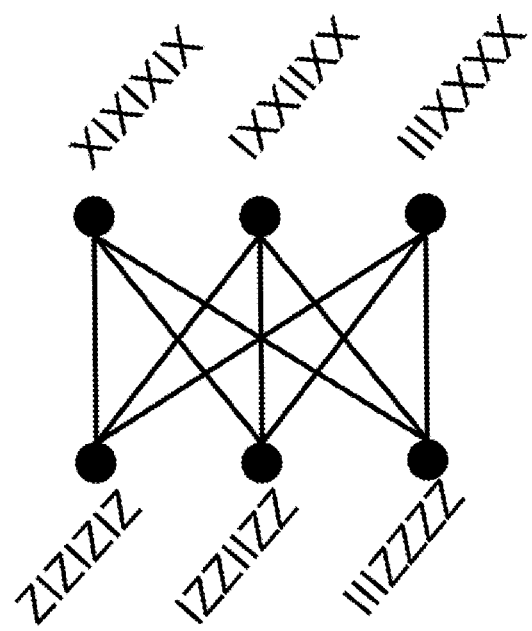
FIG. 9B shows an intersection graph of the generators of a Steane code.

FIG. 9A shows an intersection graph of the generators of a five-qubit code. FIG. 9B shows an intersection graph of the generators of a Steane code. The Steane code's intersection graph is bipartite as proven in Proposition 9.

Proposition 9. A stabilizer code C(S) is a rotated CSS code iff the intersection graph G∩(S) is bipartite.

Proof. Assume first that C(S) is a rotated CSS code. Let g be a Clifford rotation and let C(S') be the CSS code such that g maps C(S') onto C(S). The intersection graph of C(S') is bipartite because two X operators or two Z operators do not intersect. Moreover, the intersection property is preserved by local Clifford operations, which proves that the intersection graphs G∩(S) and G∩(S') are equal. Therefore G∩(S) is bipartite.

Assume now that G∩(S) is bipartite. Then, each qubit is acted on by at most two non-trivial Pauli matrices in the set S. Indeed, if there exists a qubit q and three operators $S_i$, $S_j$, $S_k$ of S acting on q as X, Y and Z respectively, then the intersection graph contains the triangle {i, j, k} which contradict the assumption that G∩(S) is bipartite.

Let $V=V^{(0)} \cap V^{(1)}$ be the partition of the vertices of G∩(S). Define $S^{(0)}=\{S_i \in S | i \in V^{(0)}\}$ and $S^{(0)}=\{S_i \in S | i \in V^{(1)}\}$ Let q be one of the n qubits. By definition of the intersection graph, all the operators of $S^{(0)}$ acts on qubit q as either I or $A_q$ where $A_q$ is a Pauli matrix X, Y or Z. Similarly, the operators of $S^{(1)}$ acts on qubit q as either I or $B_q$ where $B_q$ where Pauli matrix X, Y or Z such that $B_q \neq A_q$. By transitivity of the action of the Clifford group onto the Pauli group there exists a single-qubit Clifford operation $g_q$ that maps $A_q$ onto X and $B_q$ onto Z. The product of these single-qubit Clifford operations $g_q$ for all the qubits q maps the stabilizer code C(S) onto a CSS code, proving that this code is a rotated CSS code.

6.3. Rotated Decoder

FIG. 10 shows aspects of an example Algorithm 4 for finding the frame of a rotated CSS code. The bipartite structure of the intersection graph is used in Algorithm 4 to split Pauli errors into two components, generalizing the X/Z decomposition used for CSS codes.

Proposition 10. Let C(S) be a rotated CSS code with minimum distance d>1. If g is the operation returned by Algorithm 4, then g(C(S)) is a CSS code.

Proof. It suffices to see that the operation g computed by Algorithm 4 is the transformation that maps C(S) onto a CSS code in the proof of Proposition 9. The two-coloration constructed in step 2 is guaranteed to exist by Proposition 9. Moreover, because d>1, the matrix $A_q^{(0)}$ and $A_q^{(1)}$ are two distinct non-trivial Pauli matrices.

This result extends the CSS decoder of Proposition 8 to rotated CSS codes. Given g, it is possible to compute a CSS decoder D for the code gC(S) as in Proposition 8 and a decoder for the rotated CSS code C(S) as $D'(\sigma)=gD(\sigma)g^{-}$ was obtained. The number of syndrome computations required to build this decoder is the same as for CSS code.

6.4. Decoder Based on a Large rotated CSS subcode

The structure of CSS codes and rotated CSS codes can be exploited to build a lookup decoder faster than for general stabilizer codes. It is reasonable to expect that it is possible also speed-up the construction of a lookup decoder for stabilizer codes that are almost CSS in the sense that their stabilizer group contains a large rotated CSS subgroup. Described in this section is a decoder for a stabilizer code that contains a small number of non-CSS stabilizer generators. The same strategy immediately generalizes to the case of a stabilizer code containing a large rotated CSS subcode, but this is described for CSS subcode in order to keep the notation simple.

Consider a stabilizer code defined by $r_x$ stabilizer generators in $\overline{P}_{X_n}$, $r_Z$ stabilizer generators in $\overline{P}_{Z_n}$ and $r_*$ stabilizer generators which are arbitrary operators in $\overline{P}_n$. The set of stabilizer generators is partitioned as $S=S_X \cap S_X \cap S_*$ where the subscript X, Z, * indicate the type of the generators.

Denote by $\sigma_X \in \mathbb{Z}_2^{r_X}$ the component of the syndrome associated with the X stabilizer generators. The syndrome components $\sigma_Z$ and $\sigma_*$ are defined similarly. One cannot split the syndrome into a syndrome that corresponds to X errors and a syndrome that corresponds to Z errors because the two types of errors contribute to $\sigma_*$. A correction is obtained by considering all possible values for the contribution of the X part and the Z part of the error to $\sigma_*$.

To build a decoder for a stabilizer code with stabilizer generators $S=S_X \cap S_X \cap S_*$, $D_X$=LUD $[S_X \cap S_*, \overline{P}_{Z_n}, M]$ and $D_Z$=LUD $[S_Z \cap S_*, \overline{P}_{X_n}, M]$ are constructed. Then, $D(\sigma)$ is defined to be a minimum weight error of the form $D_X(\sigma_X, \sigma_{X,*})D_X(\sigma_Z, \sigma_{Z,*})$ where $\sigma_{X,*}, \sigma_{X,*} \in \mathbb{Z}_2^{r_*}$ satisfy $\sigma_{X,*}+\sigma_{Z,*}=\sigma_*$.

As in the case of CSS code, it is possible to build this decoder using the classical information set decoding techniques. Once the two components $D_X$ and $D_Z$ of the decoder are constructed, to find a correction for a given syndrome, one may loop over the $2^{r_*}$ possible pairs $\sigma_{X,*}, \sigma_{Z,*} \in \mathbb{Z}_2^{r_*}$ that sum to a* to find a minimum weight correction. This leads to an efficient decoder only if $r_*$ is small.

6.5. NP-completeness of the maximum rotated CSS subcode problem

The maximum rotated CSS subcode problem is now considered: Given a set of stabilizer generators $S=\{S_1, \ldots, S_r\}$ for a stabilizer code, return a maximum subset of S that generates a rotated CSS code.

Proposition 11. The maximum rotated CSS subcode problem is NP-hard and the corresponding decision problem is NP-complete.

Proof. To prove that the problem is NP-hard, a reduction of the following maximum bipartite subgraph problem is used: given a graph G, return a maximum bipartite subgraph of G. That problem is NP-complete because it is a node deletion problem for a hereditary property [Ref. 16].

Let G be a graph with r vertices. The basic idea to reduce the maximum bipartite subgraph to the maximum CSS subcode problem is to construct a stabilizer code C(S) whose intersection is G and whose size is polynomial in the size of G. Then, by Proposition 9, finding a maximum bipartite subgraph of G is equivalent to finding a maximum rotated CSS subcode of C(S).

The stabilizer group S associated with G is defined as follows. Associate two qubits denoted $q_e$ and $q_e'$ with each edge e of the graph G. To construct the stabilizer generators $S_1, \ldots, S_r$ of S, initialize them to the identity and apply the following procedure. Denote by $S_i(q)$ the component of $S_i$ on qubit q. Loop over all the edges e and if e connects vertices i and j with i<j, set $S_i(q_e)=S_i(q_e')=X$ and $S_j(q_e)=S_j(q_e')=Z$.

The resulting family generates a stabilizer group acting on $O(|V|^2)$ qubits and its intersection graph is the input graph G. Based on Proposition 9, this proves that the maximum rotated CSS subcode is NP-hard. The decision problem is clearly in NP which concludes the proof.

If the rotation g that maps the rotated CSS subcode onto a CSS code is known, then the problem becomes simpler. This is because the problem of finding a maximum CSS subgroup of a stabilizer group can be solved in polynomial time.

7. References, classical computer system, and additional description

For additional context, the interested reader is referred to the following references, which are hereby incorporated by reference herein, for all purposes.

[Ref. 1] Yu Tomita and Krysta M. Svore. Low-distance surface codes under realistic quantum noise. *Physical Review A*, 90(6):062320, 2014.

[Ref. 2] Poulami Das, Aditya Locharla, and Cody Jones. LILLIPUT: A Lightweight low-latency lookup-table based decoder for near-term quantum error correction. *arXiv preprint*, arXiv:2108.06569, 2021.

[Ref. 3] Nicolas Delfosse. Hierarchical decoding to reduce hardware requirements for quantum computing. *arXiv preprint*, arXiv:2001.11427, 2020

[Ref. 4] Eugene Prange. The use of information sets in decoding cyclic codes. *IRE Transactions on Information Theory*, 8(5):5-9, 1962.

[Ref. 5] Robert J. McEliece. A public-key cryptosystem based on algebraic. *Coding Thy*, 4244:114-116, 1978

[Ref. 6] Raphael Overbeck and Nicolas Sendrier. Code-based cryptography. In *Post-quantum cryptography*, 95-145, Springer, 2009.

[Ref. 7] Markus Grassl. Searching for linear codes with large minimum distance. In *Discovering mathematics with magma*, 287-313, Springer, 2006.

[Ref. 8] Ghazal Kachigar and Jean-Pierre Tillich. Quantum information set decoding algorithms. In *International Workshop on Post-Quantum Cryptography*, 69-89, Springer, 2017.

[Ref. 9] A. Robert Calderbank and Peter W. Shor. Good quantum error-correcting codes exist. *Physical Review A*, 54(2):1098, 1996.

[Ref. 10] Andrew Steane. Multiple-particle interference and quantum error correction. *Proceedings of the Royal Society of London. Series A: Mathematical, Physical and Engineering Sciences*, 452(1954):2551-2577, 1996.

[Ref. 11] Daniel Gottesman. *Stabilizer codes and quantum error correction*. California Institute of Technology, 1997.

[Ref. 12] Carla D. Savage and Peter Winkler. Monotone Gray codes and the middle levels problem. *Journal of Combinatorial Theory, Series A*, 70(2):230-248, 1995.

[Ref. 13] Torsten Mütze. Combinatorial Gray codes—an updated survey. *arXiv preprint*, arXiv:2202.01280, 2022.

[Ref. 14] Stefka Bouyuklieva and Iliya Bouyukliev. An Extension of the Brouwer-Zimmermann Algorithm for Calculating the Minimum Weight of a Linear Code. *Mathematics*, 9(19):2354, 2021.

[Ref. 15] Anne Canteaut and Florent Chabaud. A new algorithm for finding minimum-weight words in a linear code: Application to McEliece's cryptosystem and to narrow-sense BCH codes of length 511. *IEEE Transactions on Information Theory*, 44(1):367-378, 1998.

[Ref. 16] John M. Lewis and Mihalis Yannakakis. The node-deletion problem for hereditary properties is NP-complete. *Journal of Computer and System Sciences*, 20(2):219-230, 1980.

The methods herein may be tied to a computer system of one or more computing devices. Such methods and processes may be implemented as an application program or service, an application programming interface (API), a library, and/or other computer-program product.

Figure 11:
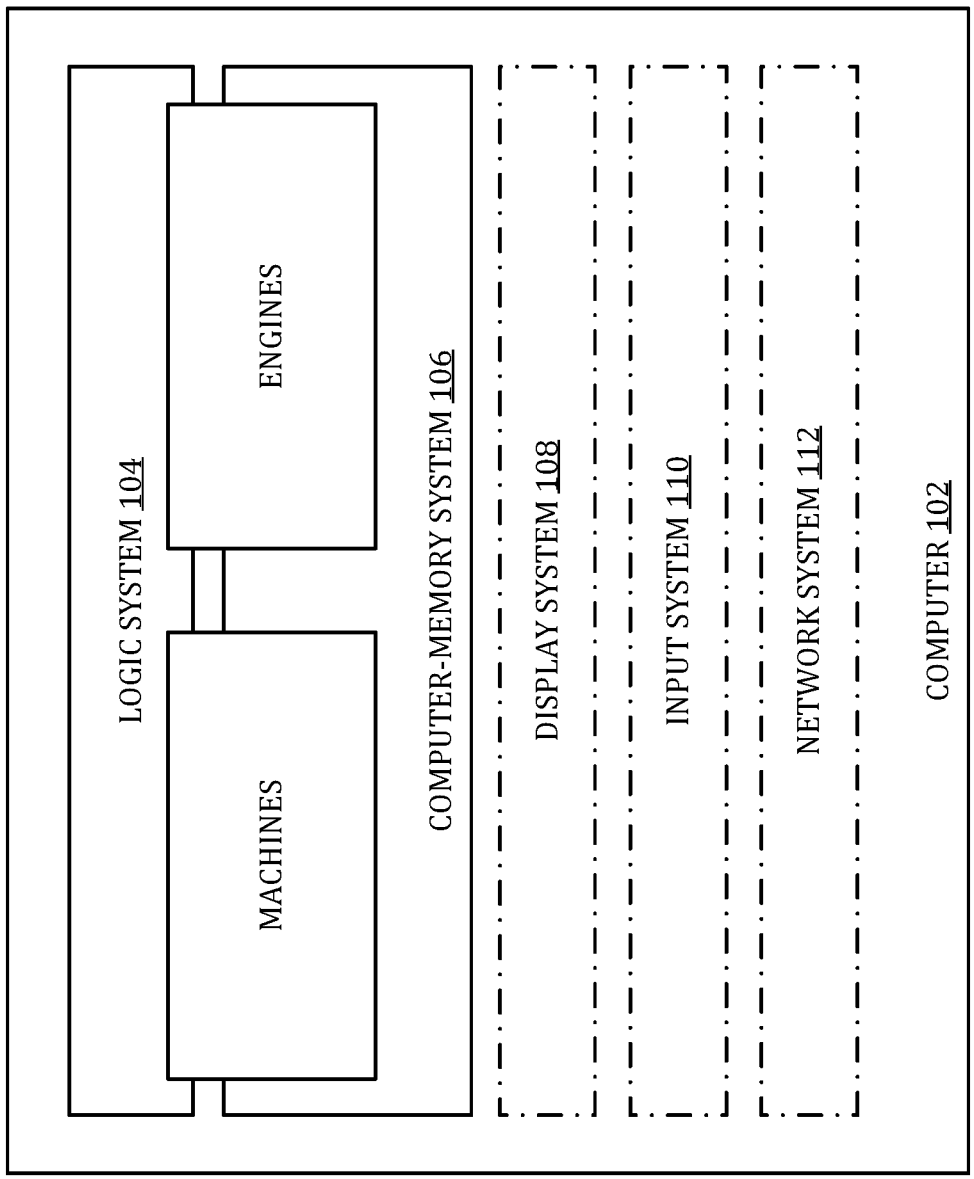
FIG. 11 shows aspects of an example classical computer system.

FIG. 11 provides a schematic representation of a classical computer 102 configured to provide some or all of the classical computer system functionality disclosed herein. Classical computer 102 may take the form of a personal computer, application-server computer, or any other computing device.

Classical computer 102 includes a logic system 104 and a computer-memory system 106. Classical computer 102 may optionally include a display system 108, an input system 110, a network system 112, and/or other systems not shown in the drawings.

Logic system 104 includes one or more physical devices configured to execute instructions. For example, the logic system may be configured to execute instructions that are part of at least one operating system (OS), application, service, and/or other program construct. The logic system may include at least one hardware processor (e.g., microprocessor, central processor, central processing unit (CPU) and/or graphics processing unit (GPU)) configured to execute software instructions. Additionally or alternatively, the logic system may include at least one hardware or firmware device configured to execute hardware or firmware instructions. A processor of the logic system may be single-core or multi-core, and the instructions executed thereon may be configured for sequential, parallel, and/or distributed processing. Individual components of the logic system optionally may be distributed among two or more separate devices, which may be remotely located and/or configured for coordinated processing. Aspects of the logic system may be virtualized and executed by remotely-accessible, networked computing devices configured in a cloud-computing configuration.

Computer-memory system 106 includes at least one physical device configured to temporarily and/or permanently hold computer system information, such as data and instructions executable by logic system 104. When the computer-memory system includes two or more devices, the devices may be collocated or remotely located. Computer-memory system 106 may include at least one volatile, nonvolatile, dynamic, static, read/write, read-only, random-access, sequential-access, location-addressable, file-addressable, and/or content-addressable computer-memory device. Computer-memory system 106 may include at least one removable and/or built-in computer-memory device. When the logic system executes instructions, the state of computer-memory system 106 may be transformed—e.g., to hold different data.

Aspects of logic system 104 and computer-memory system 106 may be integrated together into one or more hardware-logic components. Any such hardware-logic component may include at least one program- or application-specific integrated circuit (PASIC/ASIC), program- or application-specific standard product (PSSP/ASSP), system-on-a-chip (SOC), or complex programmable logic device (CPLD), for example.

Logic system 104 and computer-memory system 106 may cooperate to instantiate one or more logic machines or engines. As used herein, the terms 'machine' and 'engine' each refer collectively to a combination of cooperating hardware, firmware, software, instructions, and/or any other components that provide computer system functionality. In other words, machines and engines are never abstract ideas and always have a tangible form. A machine or engine may be instantiated by a single computing device, or a machine or engine may include two or more subcomponents instantiated by two or more different computing devices. In some implementations, a machine or engine includes a local component (e.g., a software application executed by a computer system processor) cooperating with a remote component (e.g., a cloud computing service provided by a network of one or more server computer systems). The software and/or other instructions that give a particular machine or engine its functionality may optionally be saved as one or more unexecuted modules on one or more computer-memory devices.

Machines and engines may be implemented using any suitable combination of ma-chine learning (ML) and artificial intelligence (AI) techniques. Non-limiting examples of techniques that may be incorporated in an implementation of one or more machines include support vector machines, multi-layer neural networks, convolutional neural networks (e.g., spatial convolutional networks for processing images and/or video, and/or any other suitable convolutional neural network configured to convolve and pool features across one or more temporal and/or spatial dimensions), recurrent neural networks (e.g., long short-term memory networks), associative memories (e.g., lookup tables, hash tables, bloom filters, neural Turing machines and/or neural random-access memory) unsupervised spatial and/or clustering methods (e.g., nearest neighbor algorithms, topological data analysis, and/or k-means clustering), and/or graphical models (e.g., (hidden) Markov models, Markov random fields, (hidden) conditional random fields, and/or AI knowledge bases)).

When included, display system 108 may be used to present a visual representation of data held by computer-memory system 106. The visual representation may take the form of a graphical user interface (GUI) in some examples. The display system may include one or more display devices utilizing virtually any type of technology. In some implementations, display system may include one or more virtual-, augmented-, or mixed reality displays.

When included, input system 110 may comprise or interface with one or more input devices. An input device may include a sensor device or a user input device. Examples of user input devices include a keyboard, mouse, or touch screen.

When included, network system 112 may be configured to communicatively couple classical computer 102 with one or more other computer systems. The network system may include wired and/or wireless communication devices compatible with one or more different communication protocols. The network system may be configured for communication via personal-, local- and/or wide-area networks.

In conclusion, one aspect of this disclosure is directed to a method to build a lookup decoder for mapping error syndromes based on quantum-stabilizer code to corresponding error corrections, the quantum-stabilizer code executing on a quantum computer. The method comprises: enumerating a subset of error syndromes up to a maximum error weight based on the quantum-stabilizer code; iterating through the subset of error syndromes to compute an error state of highest probability for each error syndrome of the subset, the error state defining error in a qubit register of the quantum computer; and for each error syndrome of the subset of error syndromes, storing in classical computer memory an error correction based on the error state of highest probability and mapped to that error syndrome. Enumerating error syndromes at the outset instead of computing them based on error states provides the technical benefit of faster construction of the lookup decoder table. Enumerating error syndromes up to a maximum error weight provides the additional technical benefit of avoiding wasted processor time on unlikely error states, for faster construction of the lookup decoder table. Storing error correction provides the additional technical benefit of improved reliability of quantum computer greater accuracy of quantum computation.

In some implementations the error state includes at least one classical bit string with each bit corresponding to a different qubit of the qubit register. In some implementations the at least one classical bit string includes a classical bit string of X-type quantum errors and a classical bit string of Z-type quantum errors. In some implementations the error correction mapped to a given error syndrome reverses the error state of highest probability computed for that error syndrome. This provides the additional technical benefit of end-to-end quantum error correction. In some implementations enumerating the subset of error syndromes includes omitting another subset of error syndromes within a parent set of error syndromes based on the quantum-stabilizer code. This provides an additional technical benefit of reducing the total number of error syndromes enumerated, for greater efficiency of construction of the lookup table and reduced comsumption of runtime resources. In some implementations the lookup decoder comprises a hash map. In some implementations iterating through the subset of error syndromes comprises stepping through a weight-increasing encoding map and generating a complete set of Pauli errors up to a predetermined weight for each error syndrome. In some implementations iterating through the subset of error syndromes comprises iterating through a set of products of pivot operators $\hat{g}=\hat{G}_1^{\alpha_1}\ldots\hat{G}_r^{\alpha_r}$ with weight w. In some implementations the pivot operators are selected based on an information set with a minimum number of rank-one elements. This feature provides an additional technical benefit of leveraging linear-algebraic techniques to improve processing efficiency. In some implementations iterating through the subset of error syndromes comprises, when the maximum weight M is small relative to code length n, iterating in order of increasing weight of the error states of each syndrome. In some implementations the classical computer memory is coupled to plural processing cores, and the iterating and storing for different error syndromes is enacted in parallel via the plural processing cores. This feature provides an additional technical benefit of leveraging state-of-the-art computer architecture to increase the efficiency of lookup-decoder construction. In some implementations the quantum-stabilizer code is a Calderbank-Shor-Steane (CSS) code. In some implementations the quantum-stabilizer code is a rotated Calderbank-Shor-Steane (CSS) code.

Another aspect of this disclosure is directed to a computer system coupled operatively to a quantum computer. The computer system comprises a processor and, operatively coupled to the processor, computer memory holding instructions that cause the processor to build a lookup decoder for mapping error syndromes based on quantum-stabilizer code to corresponding error corrections. The quantum-stabilizer code executes on the quantum computer, and the instructions comprise: instructions (A) for enumerating a subset of error syndromes up to a maximum weight based on the quantum-stabilizer code; instructions (B) for iterating through the subset of error syndromes to compute an error state of highest probability for each error syndrome of the subset, the error state defining error in a qubit register of the quantum computer; and instructions (C) for storing in the computer memory, for each error syndrome of the subset of error syndromes, an error correction based on the error state of highest probability and mapped to that error syndrome, wherein the error correction mapped to a given error syndrome reverses the error state of highest probability computed for that error syndrome. Enumerating error syndromes at the outset instead of computing them based on error states provides the technical benefit of faster construction of the lookup decoder table. Enumerating error syndromes up to a maximum error weight provides the additional technical benefit of avoiding wasted processor time on unlikely error states, for faster construction of the lookup decoder table. Storing error correction provides the additional technical benefit of improved reliability of quantum computer— greater accuracy of quantum computation.

In some implementations iterating through the subset of error syndromes comprises stepping through a weight-increasing encoding map and generating a complete set of Pauli errors up to a predetermined weight for each error syndrome. In some implementations iterating through the subset of error syndromes comprises iterating through a set of products of pivot operators $\hat{g}=\hat{G}_1^{\alpha_1}\ldots\hat{G}_r^{\alpha_r}$ with weight w. In some implementations the pivot operators are selected based on an information set with a minimum number of rank-one elements. This feature provides an additional technical benefit of leveraging linear-algebraic techniques to improve processing efficiency. In some implementations iterating through the subset of error syndromes comprises, when the maximum weight M is small relative to code length n, iterating in order of increasing weight of the error states of each syndrome. In some implementations the quantum-stabilizer code is a Calderbank-Shor-Steane (CSS) code or a rotated CSS code. In some implementations the lookup decoder is a pre-decoder arranged operationally upstream of another decoder.

Another aspect of this disclosure is directed to a computer system coupled operatively to a quantum computer, the computer system comprises a processor and, operatively coupled to the processor, computer memory holding instructions that cause the processor to build a lookup decoder for mapping error syndromes based on quantum-stabilizer code to corresponding error corrections. The quantum-stabilizer code executes on the quantum computer, and the instructions comprise: instructions (A) for enumerating a subset of error syndromes of highest probability based on the quantum-stabilizer code, instructions (B) for iterating through the subset of error syndromes to compute an error state of highest probability for each error syndrome of the subset, the error state defining error in a qubit register of the quantum computer, instructions (C) for storing in the computer memory, for each error syndrome of the subset of error syndromes, an error correction based on the error state of highest probability and mapped to that error syndrome, instructions (D) to recognize a runtime error syndrome generated via operation of the quantum computer, instructions (E) to retrieve the error correction stored for the runtime error syndrome, and instructions (F) to adjust operation of the quantum computer based on the error correction retrieved. Enumerating error syndromes at the outset instead of computing them based on error states provides the technical benefit of faster construction of the lookup decoder table. Enumerating error syndromes up to a maximum error weight provides the additional technical benefit of avoiding wasted processor time on unlikely error states, for faster construction of the lookup decoder table. Storing error correction provides the additional technical benefit of improved reliability of quantum computer greater accuracy of quantum computation.

This disclosure is presented by way of example and with reference to the attached drawing figures. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method to build a lookup decoder for mapping error syndromes based on quantum-stabilizer code to corresponding error corrections, the quantum-stabilizer code executing on a quantum computer, the method comprising:
enumerating a subset of error syndromes up to a maximum error weight based on the quantum-stabilizer code;
iterating through the subset of error syndromes to compute an error state of highest probability for each error syndrome of the subset, the error state defining error in a qubit register of the quantum computer; and
for each error syndrome of the subset of error syndromes, storing in classical computer memory an error correction based on the error state of highest probability and mapped to that error syndrome.

2. The method of claim 1 wherein the error state includes at least one classical bit string with each bit corresponding to a different qubit of the qubit register.

3. The method of claim 1 wherein the at least one classical bit string includes a classical bit string of X-type quantum errors and a classical bit string of Z-type quantum errors.

4. The method of claim 1 wherein the error correction mapped to a given error syndrome reverses the error state of highest probability computed for that error syndrome.

5. The method of claim 1 wherein enumerating the subset of error syndromes includes omitting another subset of error syndromes within a parent set of error syndromes based on the quantum-stabilizer code.

6. The method of claim 1 wherein the lookup decoder comprises a hash map.

7. The method of claim 1 wherein iterating through the subset of error syndromes comprises stepping through a weight-increasing encoding map and generating a complete set of Pauli errors up to a predetermined weight for each error syndrome.

8. The method of claim 1 wherein iterating through the subset of error syndromes comprises iterating through a set of products of pivot operators $\hat{g}=\hat{G}_1^{\alpha_1}\ldots\hat{G}_r^{\alpha_r}$ with weight w.

9. The method of claim 8 wherein the pivot operators are selected based on an information set with a minimum number of rank-one elements.

10. The method of claim 1 wherein iterating through the subset of error syndromes comprises, when the maximum weight M is small relative to code length n, iterating in order of increasing weight of the error states of each syndrome.

11. The method of claim 1 wherein the classical computer memory is coupled to plural processing cores, and wherein the iterating and storing for different error syndromes is enacted in parallel via the plural processing cores.

12. The method of claim 1 wherein the quantum-stabilizer code is a Calderbank-Shor-Steane (CSS) S) code.

13. The method of claim 1 wherein the quantum-stabilizer code is a rotated Calderbank-Shor-Steane (CSS) S) code.

14. A computer system coupled operatively to a quantum computer, the computer system comprising:
a processor; and
operatively coupled to the processor, computer memory holding instructions that cause the processor to build a lookup decoder for mapping error syndromes based on quantum-stabilizer code to corresponding error corrections, the quantum-stabilizer code executing on the quantum computer, the instructions comprising:
instructions (A) for enumerating a subset of error syndromes up to a maximum weight based on the quantum-stabilizer code;
instructions (B) for iterating through the subset of error syndromes to compute an error state of highest probability for each error syndrome of the subset, the error state defining error in a qubit register of the quantum computer; and
instructions (C) for storing in the computer memory, for each error syndrome of the subset of error syndromes, an error correction based on the error state of highest probability and mapped to that error syndrome, wherein the error correction mapped to a given error syndrome reverses the error state of highest probability computed for that error syndrome.

15. The computer system of claim 14 wherein iterating through the subset of error syndromes comprises stepping through a weight-increasing encoding map and generating a complete set of Pauli errors up to a predetermined weight for each error syndrome.

16. The computer system of claim 14 wherein iterating through the subset of error syndromes comprises iterating through a set of products of pivot operators $\hat{g}=\hat{G}_1^{\alpha_1}\ldots\hat{G}_r^{\alpha_r}$ with weight w.

17. The computer system of claim 16 wherein the pivot operators are selected based on an information set with a minimum number of rank-one elements.

18. The computer system of claim 14 wherein iterating through the subset of error syndromes comprises, when the maximum weight M is small relative to code length n, iterating in order of increasing weight of the error states of each syndrome.

19. The computer system of claim 14 wherein the lookup decoder is a pre-decoder arranged operationally upstream of another decoder.

20. A computer system coupled operatively to a quantum computer, the computer system comprising:
- a processor; and
- operatively coupled to the processor, computer memory holding instructions that cause the processor to build a lookup decoder for mapping error syndromes based on quantum-stabilizer code to corresponding error corrections, the quantum-stabilizer code executing on the quantum computer, the instructions comprising:
  - instructions (A) for enumerating a subset of error syndromes of highest probability based on the quantum-stabilizer code,
  - instructions (B) for iterating through the subset of error syndromes to compute an error state of highest probability for each error syndrome of the subset, the error state defining error in a qubit register of the quantum computer,
  - instructions (C) for storing in the computer memory, for each error syndrome of the subset of error syndromes, an error correction based on the error state of highest probability and mapped to that error syndrome,
  - instructions (D) to recognize a runtime error syndrome generated via operation of the quantum computer,
  - instructions (E) to retrieve the error correction stored for the runtime error syndrome, and
  - instructions (F) to adjust operation of the quantum computer based on the error correction retrieved.

* * * * *